(12) United States Patent
Rebstock

(10) Patent No.: US 10,593,576 B2
(45) Date of Patent: Mar. 17, 2020

(54) INSPECTION SYSTEM

(71) Applicant: BROOKS AUTOMATION (GERMANY) GmbH, Jena (DE)

(72) Inventor: Lutz Rebstock, Radolfzell (DE)

(73) Assignee: Brooks Automation (Germany) GmbH, Jena (DE)

( * ) Notice: Subject to any disclaimer, the term of this patent is extended or adjusted under 35 U.S.C. 154(b) by 0 days.

(21) Appl. No.: 15/555,347

(22) PCT Filed: Mar. 2, 2016

(86) PCT No.: PCT/EP2016/054431
§ 371 (c)(1),
(2) Date: Sep. 1, 2017

(87) PCT Pub. No.: WO2016/139249
PCT Pub. Date: Sep. 9, 2016

(65) Prior Publication Data
US 2018/0040494 A1 Feb. 8, 2018

Related U.S. Application Data

(60) Provisional application No. 62/127,290, filed on Mar. 3, 2015.

(51) Int. Cl.
*H01L 21/67* (2006.01)
*H01L 21/66* (2006.01)
(Continued)

(52) U.S. Cl.
CPC ...... *H01L 21/67265* (2013.01); *G06T 7/0004* (2013.01); *H01L 21/67259* (2013.01);
(Continued)

(58) Field of Classification Search
CPC ......... H01L 21/67265; H01L 21/67259; H01L 21/67288; H01L 22/12; G06T 7/0004;
(Continued)

(56) References Cited

U.S. PATENT DOCUMENTS 6,330,885 B1 * 12/2001 Weissman ............ A61B 5/0031
128/899
6,449,035 B1    9/2002 Batchelder
6,813,032 B1 * 11/2004 Hunter ............... G01N 21/8903
250/559.22
7,280,197 B1 * 10/2007 Rosengaus ......... G01N 21/8806
356/237.1

(Continued)

FOREIGN PATENT DOCUMENTS

WO    2009/023787 A2    2/2009

OTHER PUBLICATIONS

PCT/EP2016/054431 International Search Report and Written Opinion dated Aug. 1, 2016, 17 pages.

*Primary Examiner* — Isiaka O Akanbi
(74) *Attorney, Agent, or Firm* — Perman & Green, LLC; Colin C. Durham

(57) ABSTRACT

The invention relates to an inspection system adapted for determining a state and/or content of a wafer or reticle container or at least a part of a wafer or reticle container, comprising a detection device or a multitude of detection devices (102, 104, 152, 154, 156, 158, 160, 164) adapted to receive detection data from a surface and/or interior of the wafer or reticle container or the part of a wafer or reticle container indicative of the state and/or content of the wafer or reticle container or the part of a wafer or reticle container.

26 Claims, 18 Drawing Sheets

(51) Int. Cl.
*G06T 7/00* (2017.01)
*H04N 5/225* (2006.01)
*H04N 5/247* (2006.01)

(52) U.S. Cl.
CPC ........ *H01L 21/67288* (2013.01); *H01L 22/12* (2013.01); *H04N 5/2256* (2013.01); *H04N 5/247* (2013.01); *G06T 2207/30148* (2013.01)

(58) Field of Classification Search
CPC ........ G06T 2207/30148; H04N 5/2256; H04N 5/247
See application file for complete search history.

(56) References Cited

U.S. PATENT DOCUMENTS

| | | |
|---|---|---|
| 2002/0017599 A1 | 2/2002 | Shimizu |
| 2003/0128366 A1* | 7/2003 | Deason .................... G01B 9/04 356/502 |
| 2005/0035313 A1 | 2/2005 | Garssen et al. |
| 2006/0131521 A1* | 6/2006 | Garssen .................. G01V 8/10 250/559.33 |
| 2007/0259290 A1* | 11/2007 | Okita .................... G01N 21/956 430/312 |
| 2008/0038675 A1* | 2/2008 | Nagasaka ........... G03F 7/70341 430/322 |
| 2009/0064760 A1 | 3/2009 | Moriya et al. |
| 2009/0073405 A1* | 3/2009 | Kanaya ............... G03F 7/70725 355/53 |

* cited by examiner

INSPECTION SYSTEM

The application relates to inspection systems adapted for determining a state and/or content of a wafer or reticle container, and also an inspection chamber for determining a state and/or content of such a container.

While the application refers to front opening unified pods (FOUP) as a preferred example, the invention is applicable to any kind of wafer or reticle container. As a further example, front opening shipping boxes (FOSB) are mentioned.

In semiconductor wafer processing, robotic mechanisms are constantly arranging, organizing, and processing wafers and wafer containers, such as a front opening unified pod (FOUP). The FOUP maybe damaged in the process (e.g. scratch, break, deform, etc.). There exists a need to efficiently inspect the FOUPs for such damages and/or defects.

Wafer or reticle containers such as FOUPs are also liable to contamination, by which for example a wafer manufacturing process is rendered less effective.

According to the invention, there is suggested an inspection system comprising the features of claim 1, together with an inspection chamber comprising the features of claim 19.

It is specified in the claims that the system according to the invention comprises "a detection device or a multitude of detection devices". This especially corresponds to the wording "at least one detection device", as used in the description.

According to the invention, at least one detection device is adapted to receive detection data from a surface or an interior of a wafer or reticle container or at least part of such a container indicative of the state and/or content of the container or at least a part of the container. The term "interior" in this connection shall especially mean the interior regions of walls or lids, i. e. regions below the surfaces of such walls or lids.

Preferred embodiments of the invention are the subject matter of the dependent claims.

According to a first preferred embodiment, the wafer or reticle container is a front opening unified pod (FOUP). In order to provide an effective handling of wafers during a wafer processing, it is at most importance that FOUPs are in immaculate condition in order to avoid any kind of mishandling or contamination of wafers.

According to a first preferred embodiment of the invention, the detection device comprises at least one camera, the detection data being provided as image data. A camera is a preferred detection device for receiving detection data from a surface of a container.

Advantageously, at least two cameras are provided, at least one of which is adapted to provide a variable visual field. For example, a first camera can be provided which is adapted to provide a panoramic view of a complete surface or side of a container, together with a second camera for providing a variable visual field, which can be substantially smaller than that of the first camera. By means of such an arrangement, general features of a container can be detected at the same time as detailed features. A camera can be provided within a zoom-system in order to vary the size of its visual field.

Preferably, at least one detection device is coupled to a positioning system. Such a coupling to a positioning system facilitates actual measurements of container dimensions or features on the basis of detection data.

Preferably, at least one detection device, especially a camera, is provided to be coupled to a linear guide and/or to swivelling and/or pivoting means. By means of such coupling, a field of view of a detection device, especially visual field of a camera, can be expediently adjusted, for example to alternate between providing a general field of view, and a specific field of view, and also in order to perform scanning of an area of interest on a container surface.

Expediently, the detection device is adapted to produce a digital image of an area of interest on the surface of a container, especially a FOUP, the inspection system further comprising a data processing unit adapted for processing produced digital images by means of an algorithm coupled to a memory and a processor of the data processing unit to identify the state and/or content of the container. In this connection, it is especially possible to determine damage to a FOUP, for example a broken-off or damaged feature of a FOUP, such as a gasket, a grommet or a handling flange, and also defects, such as distortions, for example due to exposure to heat or other outside influences.

According to a preferred embodiment, at least one camera includes a reflecting mirror comprising two or more reflecting surfaces to split incident light into two or more portions and to direct these portions onto two or more linear image sensing devices mounted on an inner surface of a camera body at separate positions. The reflecting surfaces can especially be provided as symmetrical reflecting surfaces. For example, the reflecting mirrors can be inserted into the inside of a container in order to optimally reflect incident light to the linear image sensing devices. In this way, an inside of a container can be effectively checked for damage or defects. Furthermore, at least one camera is advantageously provided with adjustable shielding plates adapted to vary a field of view. Such shielding plates can effectively serve as apertures.

According to a further preferred embodiment of the invention, the at least one detection device comprises an ultrasonic detection device and/or a laser detection device. Such devices can be provided alternatively or additionally to a camera. An ultrasonic detection device is especially advantageous in case of detecting features of a container which are not detectable by camera. An ultrasonic detection device comprises at least one ultrasonic sensor, which emits a sonic pulse, and detects an echo pulse from an object, on which the sonic pulse impinges. On the basis of detected echo pulse characteristics, for example frequency and/or amplitude, defects in an object or a material can be ascertained, as well as thickness measurements performed. Especially, hairline cracks, which are not detectable by a camera, can be detected in this way. For example, FOUPs must be regularly subjected to a purge, for example using $N_2$ in order to prevent contamination of FOUP content. An $N_2$ purge is effected by means of a nozzle typically provided in the base of a FOUP. In order to prevent any contamination, the nozzle interacts with a grommet. In case such a grommet is misaligned, or its material has overtime, deteriorated contamination of the FOUP, especially during a purge, can not be prevented. Inspection of a grommet, which is not accessible to a camera, is achievable by means of an ultrasonic detection device.

Laser detection devices can especially be utilized to confirm specific measurements of a FOUP.

According to a preferred embodiment, which can also be utilized alternatively or in addition to previously mentioned detection devices, the at least one detection device comprises at least one device for measuring the weight of a wafer or reticle container, especially FOUP. This device is especially advantageous in that a content of a FOUP can thus be ascertained, without actually having to open a FOUP, for example by removing its lid. Thus, a danger of contamination of the content of a FOUP can be effectively minimized.

Advantageously, the device for measuring the weight of a FOUP comprises at least one load cell. Load cells are readily available and can be easily handled.

Advantageously, the inspection system comprises at least one light source and/or mirror. Especially, such light sources or mirrors can be positioned and/or moved into or within the inside of a container, especially a FOUP, the state and/or content of which is to be checked. Advantageously, a camera can be positioned outside of a container, whereas light sources and/or mirrors can be positioned within a container. The positions and/or orientations of such light sources and mirrors can be readily adapted to cooperate with such a camera and/or an actual shape of a container in an optimal manner.

According to a preferred embodiment, at least one light source or mirror comprises a plurality of linear light sources and/or mirrors arranged in a square-shaped configuration, a circular-shaped configuration, a triangular-shaped configuration or an oval-shaped configuration or any combination thereof. By means of such configurations, the linear light sources can be adapted to optimally light various surfaces or regions of a container. For example, a light source comprising four linear light sources and/or mirrors arranged in a square-shaped configuration can be adapted to illuminate a correspondingly shaped gasket arranged between a FOUP body and a FOUP lid.

Advantageously, the at least one detection device, especially a camera, is adapted to scan an inspection window, wherein the inspection window is square-shaped, circular-shaped, triangular-shaped, oval-shaped or any combination thereof, the detection device being adapted to scan the inspection window continuously or intermittently.

Advantageously, the inspection window comprises a double square-shaped inspection field adapted to correspond to a seal or a gasket of a FOUP. The term "double square-shaped" in this connection means a region defined by two concentric squares, i. e. a frame like region. By scanning such an inspection window, a gasket of a FOUP provided between the body and the lid of a FOUP can be readily examined.

In at least one embodiment, the present invention discloses systems and methods for determining damages and/or defects to FOUPs by scanning a visual field using a camera. One or more camera may be installed inside a visual inspection chamber of a wafer processing system, wherein one or more FOUP may be positioned. The camera may be configured to move along one or more linear guides. The movement of the camera may allow wider scanning of a particular area of interest of the FOUP. The particular area of interest may be an inner or an outer surface of the FOUP. The scanning of the particular area of interest may produce a digital image of the particular area of interest. The produced image may be used by an algorithm coupled to a memory and a processor of a data processing unit to identify damages and/or defects. The camera may include a reflecting mirror that may comprise two symmetrical reflecting surfaces to split incident light into two portions and direct them onto two linear image sensing devices which may be mounted on an inner surface of a camera body at separate positions. Adjustable shielding plates may be used to vary the field of view of the linear image sensing devices. The light received, e.g. luminance variation of the surface, is converted into electrical signals which may be processed by a data processing system. A difference signal between output signals derived from the two linear image sensing devices may indicate presence of damage and/or defect of the FOUP. The output signals may be identical when no defect exists. For visual inspection of surfaces having a complicated or rugged surface, e.g. a gasket, an insulator, multiple cameras may be used. Other methods of detection may also be used, such as through an ultrasonic detection system and/or a laser detection system. The laser detection system may be a laser line scanner.

In at least one embodiment, the present invention discloses an ultrasonic detection system that may be coupled with the visual inspection system or may be a standalone system. An ultrasonic detection device is a preferred detection device for receiving detection data from an interior and/or a surface of a container. The ultrasonic detection system may have a wide variety of uses, including object detection, range finding, level sensing, and etc. The system may include an ultrasonic transducer that may be coupled to an ultrasonic transmitter and receiver unit, which is capable of transmitting, as well receiving an ultrasonic beam. An ultrasonic transmitter and receiver unit may be used to transmit an electrical AC pulse at ultrasonic frequencies (15-100 KHz). This electrical pulse may cause the transducer to vibrate and thereby transmit a pulse of ultrasonic energy toward the object to be detected. When this pulse reaches the object, the pulse may be reflected back to the transmitter and receiver unit. The time difference between the transmitted and received pulse may be used to calculate the range of the object. The range of the object may be inputted into an algorithm to determine the presence of defects and/or deformities on the FOUP.

In addition, the ultrasonic detection system may be configured to determine the presence of a gasket on the FOUP. The system may be configured to direct an ultrasonic transducer to the gasket, and move along its perimeter, while making a circular motion, if the gasket is an O-ring.

The ultrasonic detection system may include vibration absorbing damping systems in their mounting to prevent such direct transmission of ultrasonic energy. The system may also include a radiator for controlling the dispersion of the ultrasonic beam. For example, horn structures may be used to direct the path of the ultrasonic energy into a specific, defined direction. An encapsulating member may surround the ultrasonic transducer for damping ultrasonic energy transmitted by the transducer in all but on direction.

In at least one embodiment, the present invention discloses systems and methods of determining the presence of one or more wafers inside a FOUP by measuring the weight of the FOUP. In the past, this was achieved by visual confirmation from a human operator; however, with some FOUPs comprising impurity such as carbon, the FOUP may be opaque and efficacy of the visual confirmation may be comprised.

A load cell may be placed at the base of the system and may accept a FOUP on its top surface. The FOUP may be open or closed. A load cell may be any device that creates an electrical signal that has a magnitude directly proportional to the force being measured. The load cell may be a strain gauge load cell, a piezoelectric load cell, a hydraulic load cell, a pneumatic load cell, a capacitive load cell, a vibrating wire load cell, and etc. The electrical signal may be processed in a data processing unit to determine the presence of one or more wafers within the FOUP. The system may be able to specify the exact amount of wafers within the FOUP by the FOUP's total weight. The calculation may comprise of subtracting the weight of an empty FOUP by the total weight of the FOUP comprising one or more wafers, and then dividing the total weight by the weight of a single wafer—the product of which is the total number of wafers present within the FOUP.

Preferred embodiments will now be described referring to the accompanying figures. Herein:

Figure 5:
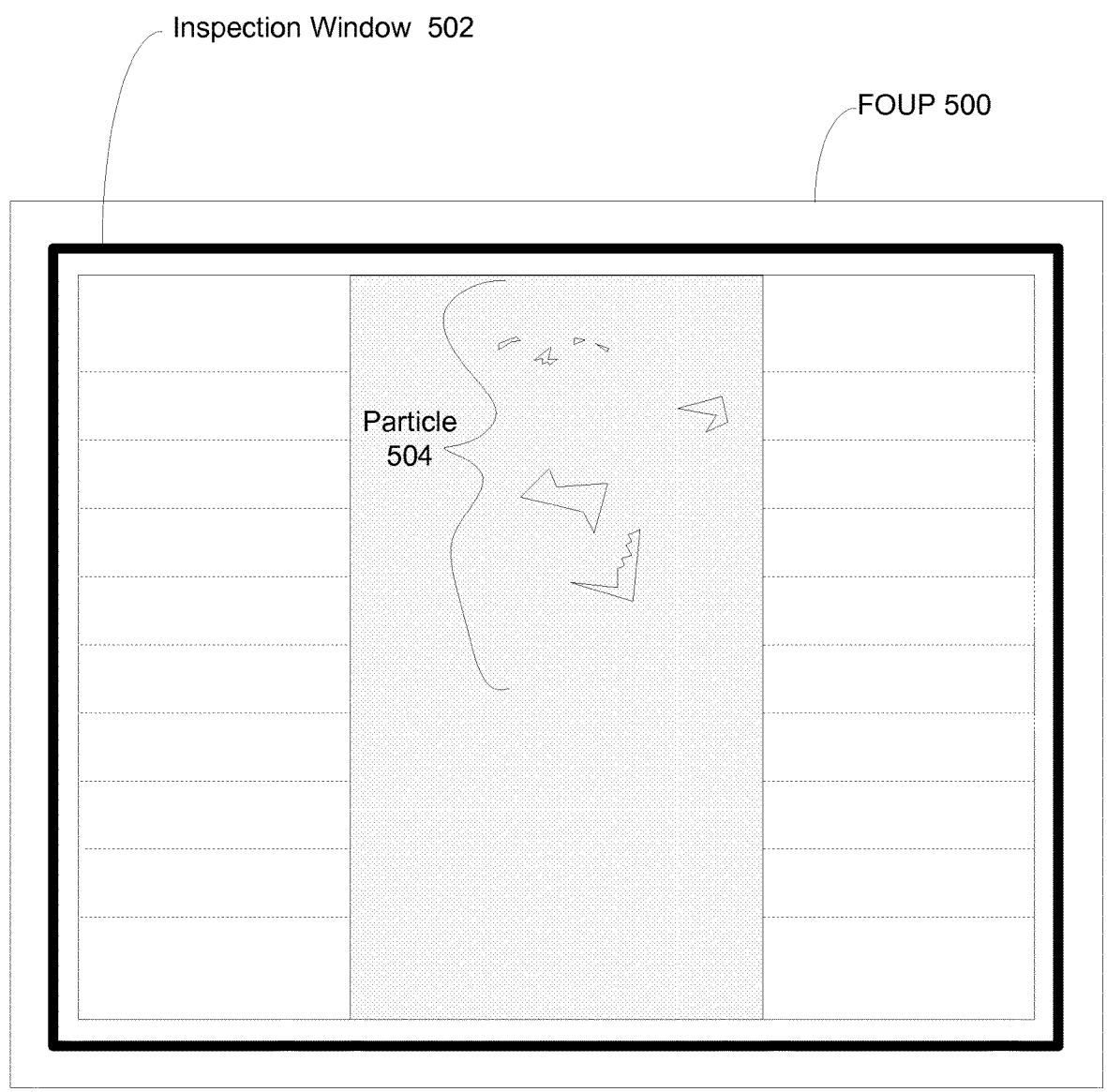
Figure 6:
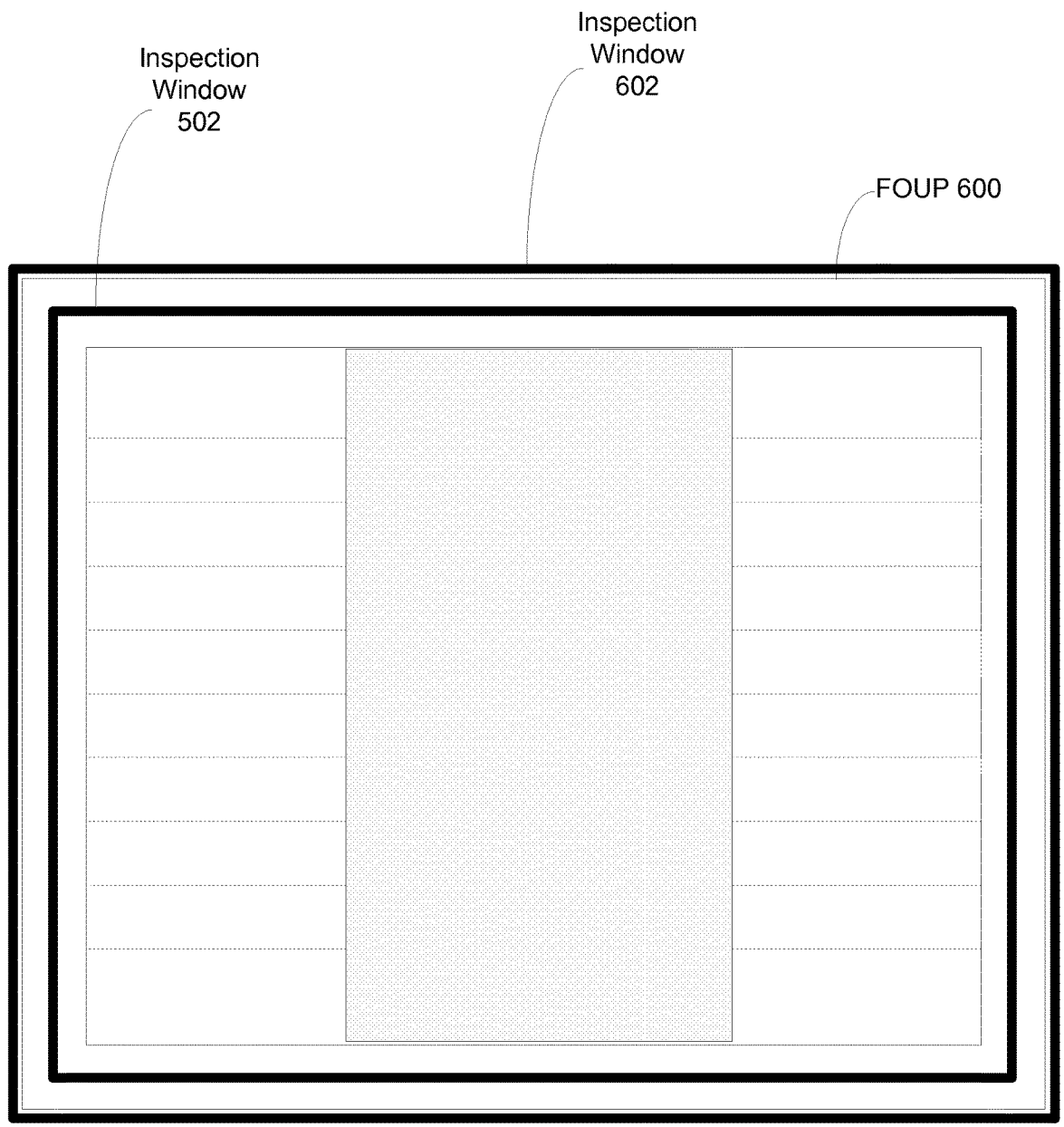
Figure 7:
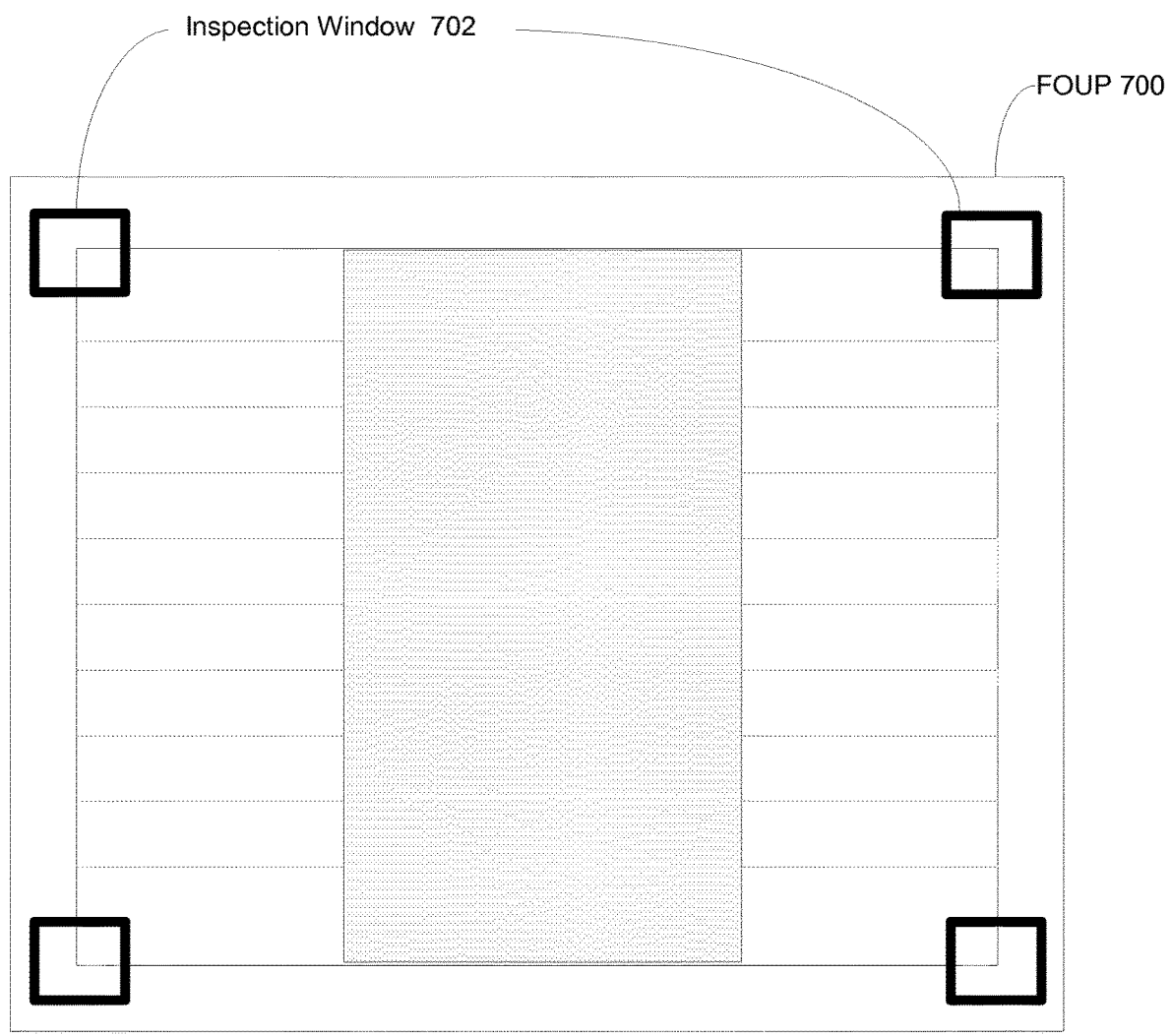
Figure 8:
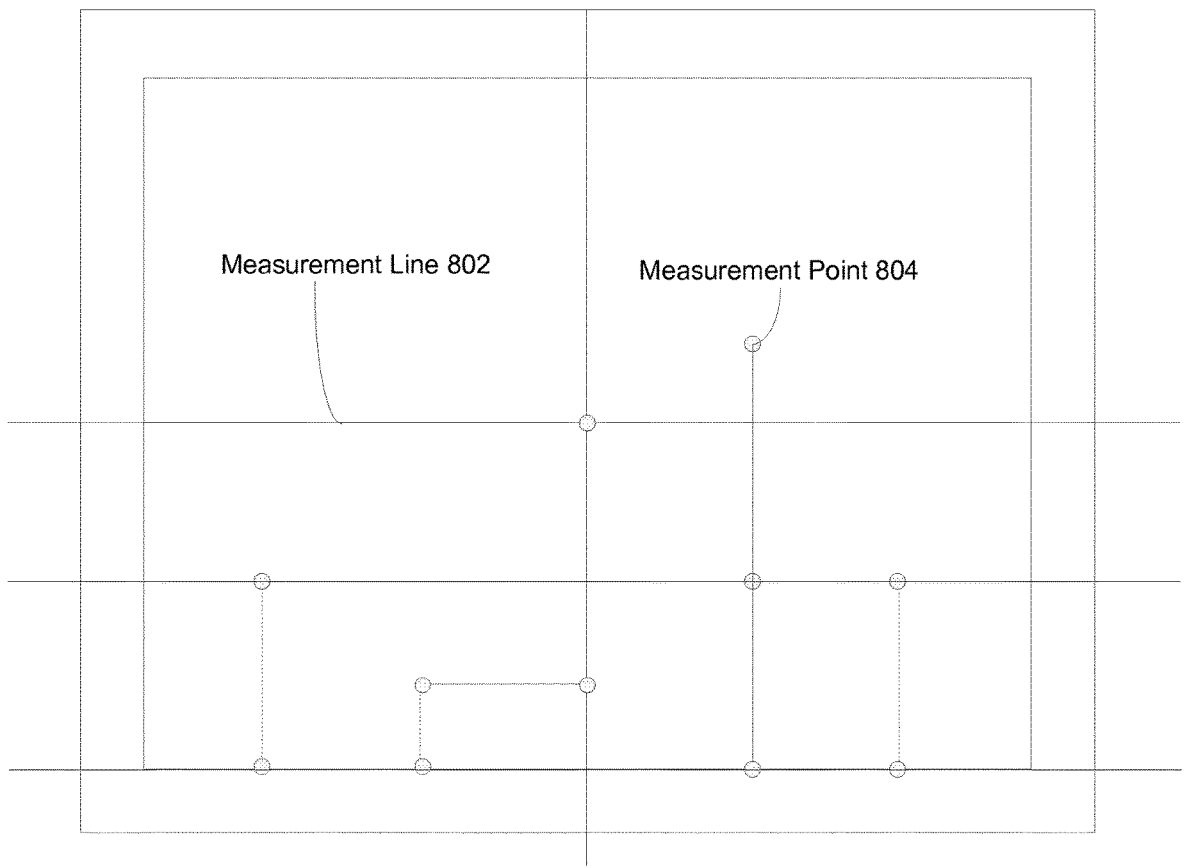
Figure 9:
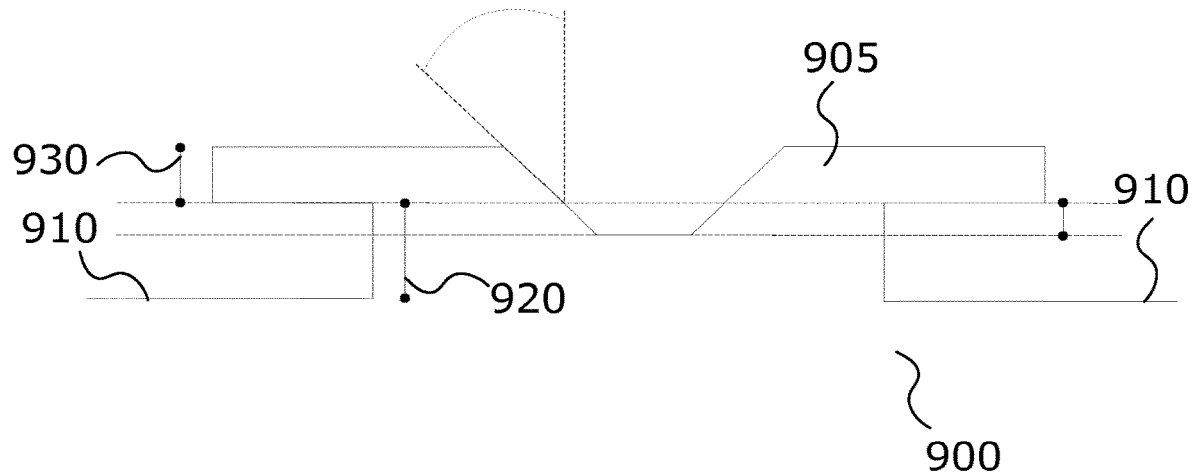
Figure 10:
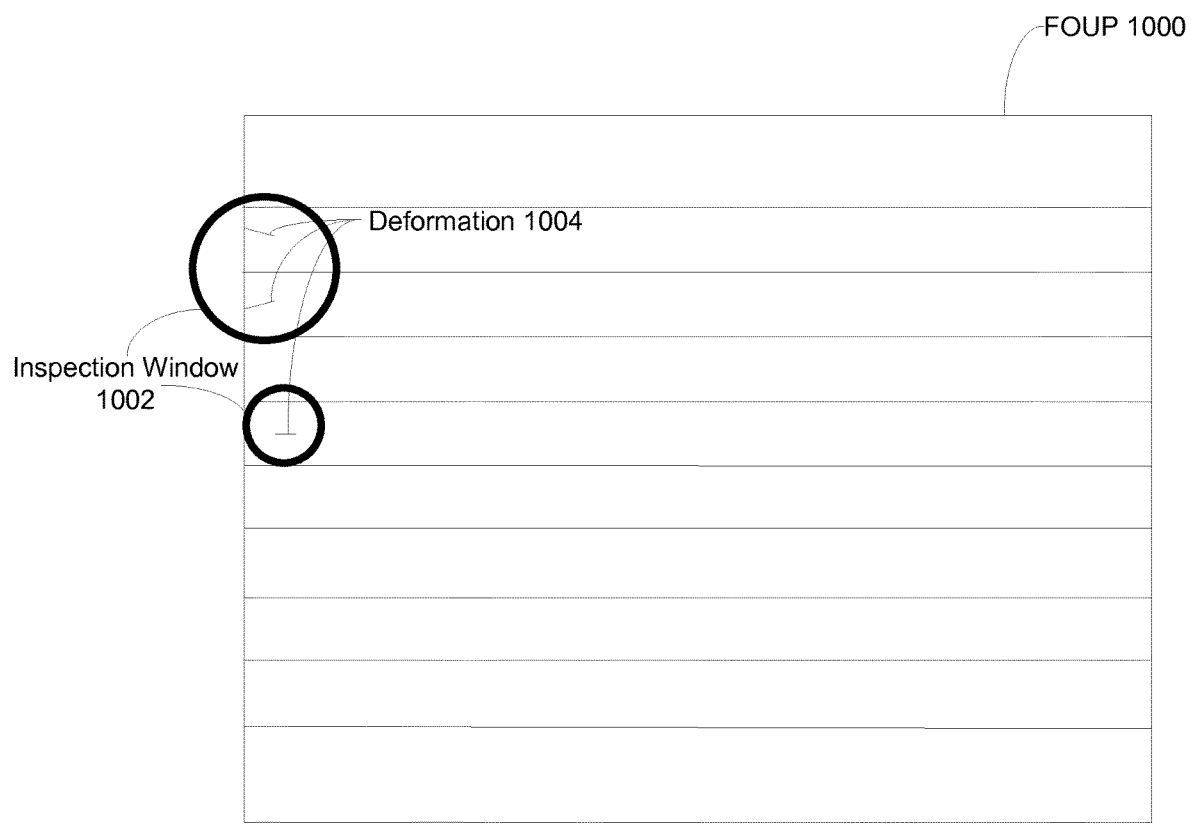
Figure 11:
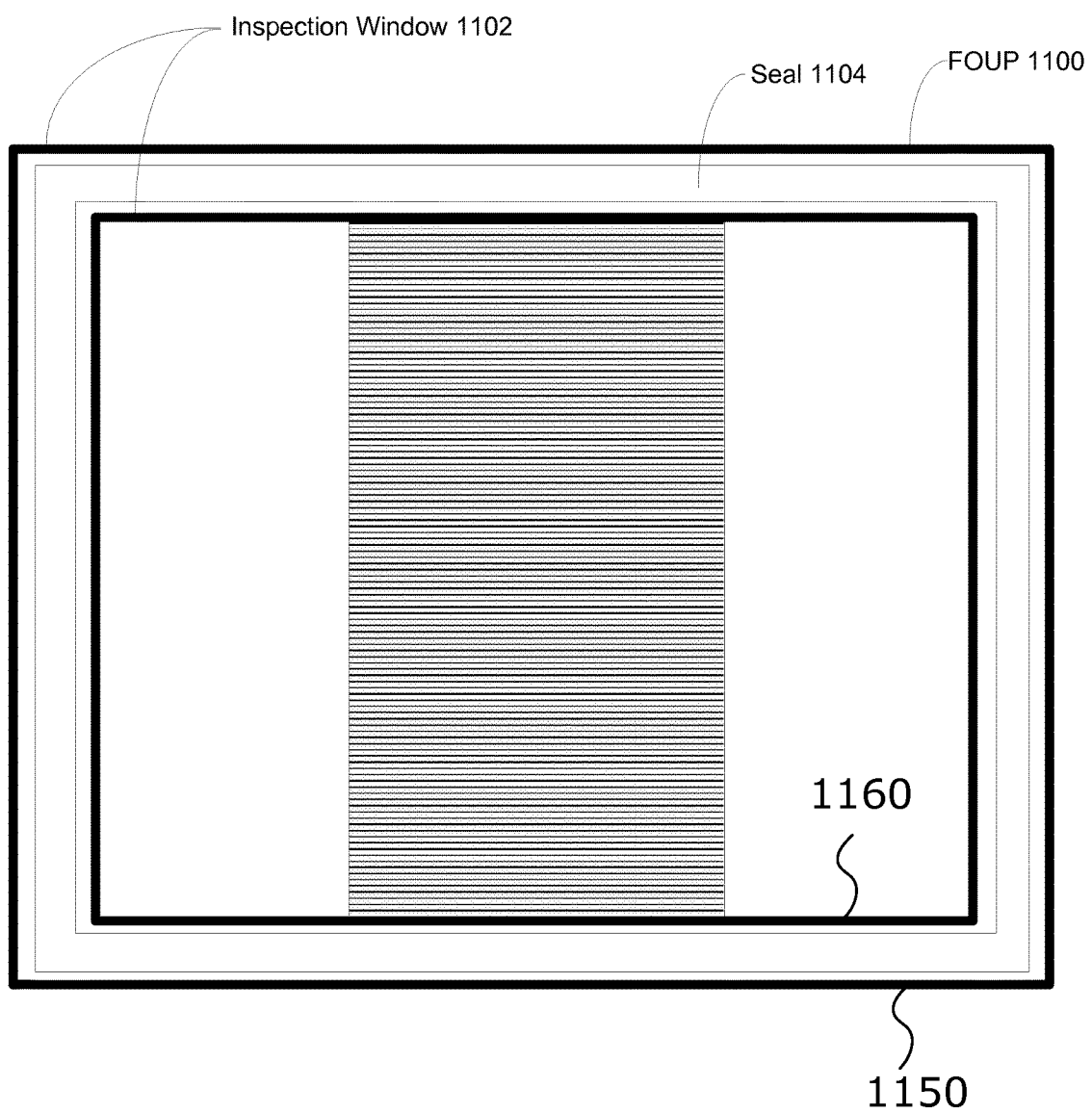
Figure 12:
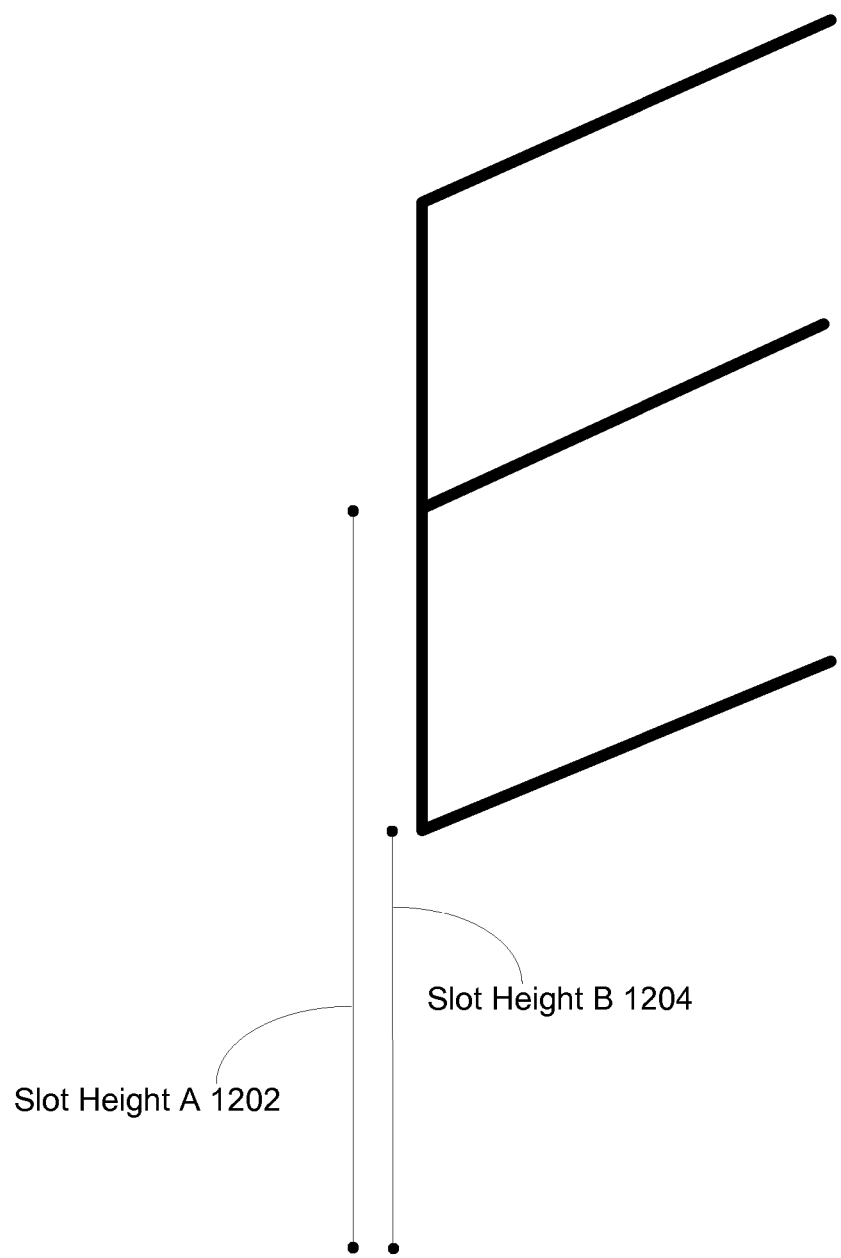
Figure 13:
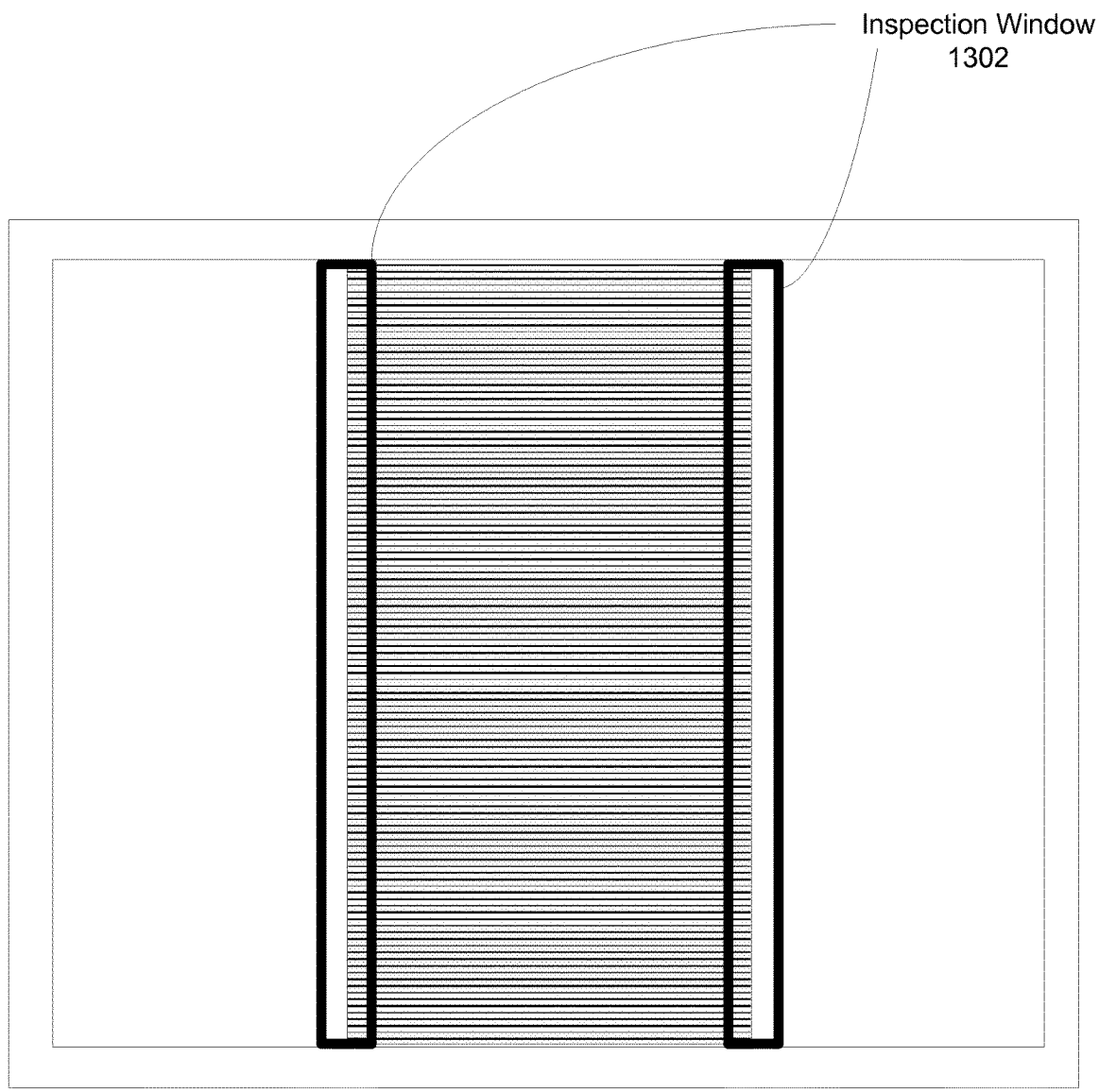
Figure 14:
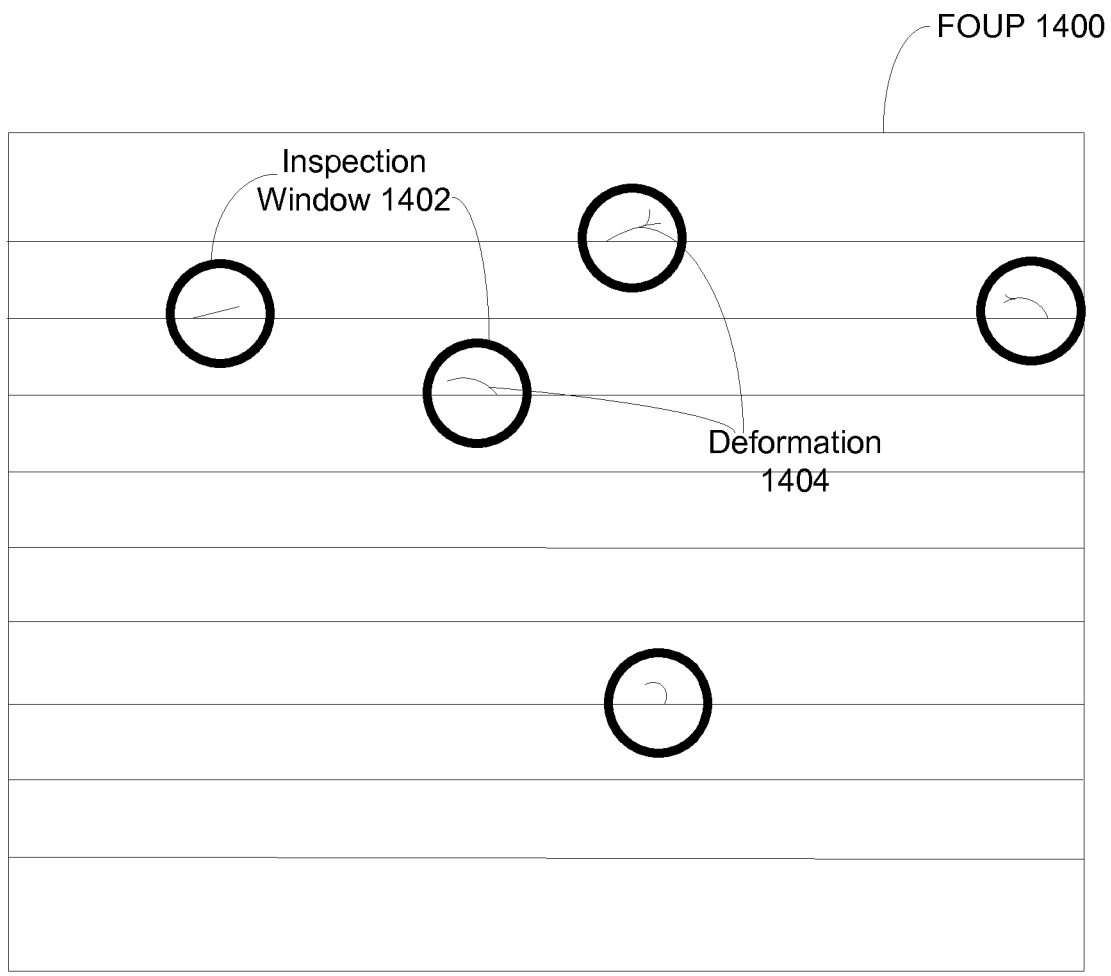
Figure 15:
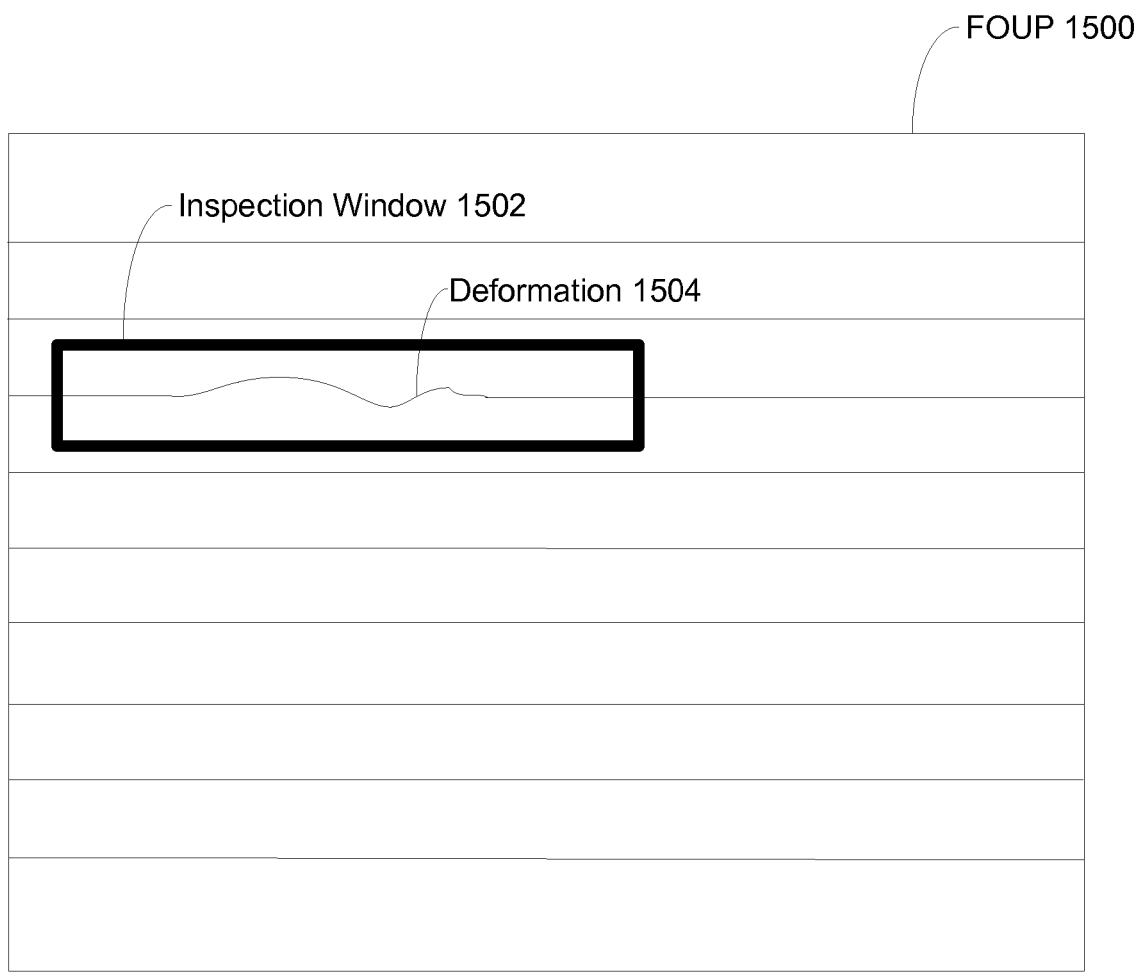
Figure 16:
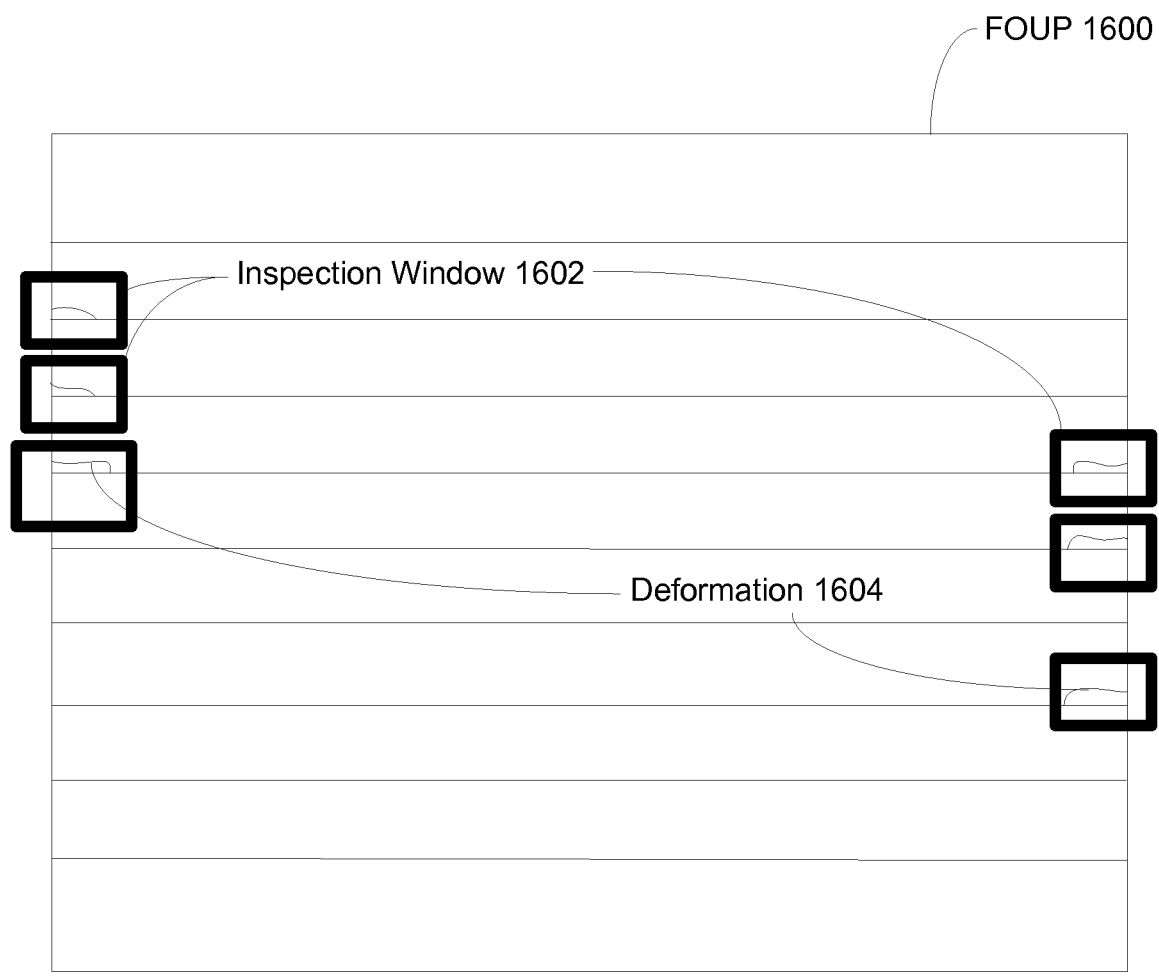

FIG. 5 is a further schematic side view of a front opening of a FOUP, showing further details, FIG. 6 is a further side view of a front opening of a FOUP, showing further details, FIG. 7 is a further schematic side view of a front opening of a FOUP, FIG. 8 is a schematic view of a door of a FOUP, FIG. 9 is a schematic sectional view of a handling flange of a FOUP, FIG. 10 is a schematic view of an inner side wall of a FOUP, FIG. 11 is a schematic view of an inner wall of a lid of a FOUP, FIG. 12 is a schematic view of an inner side wall of a FOUP, FIG. 13 is a schematic view of an inner wall of a lid of a FOUP, FIG. 14 is a schematic view of an inner side of a FOUP, FIG. 15 is a schematic view of an inner side wall of a FOUP, FIG. 16 is a schematic view of an inner side wall of a FOUP.

Figure 17:
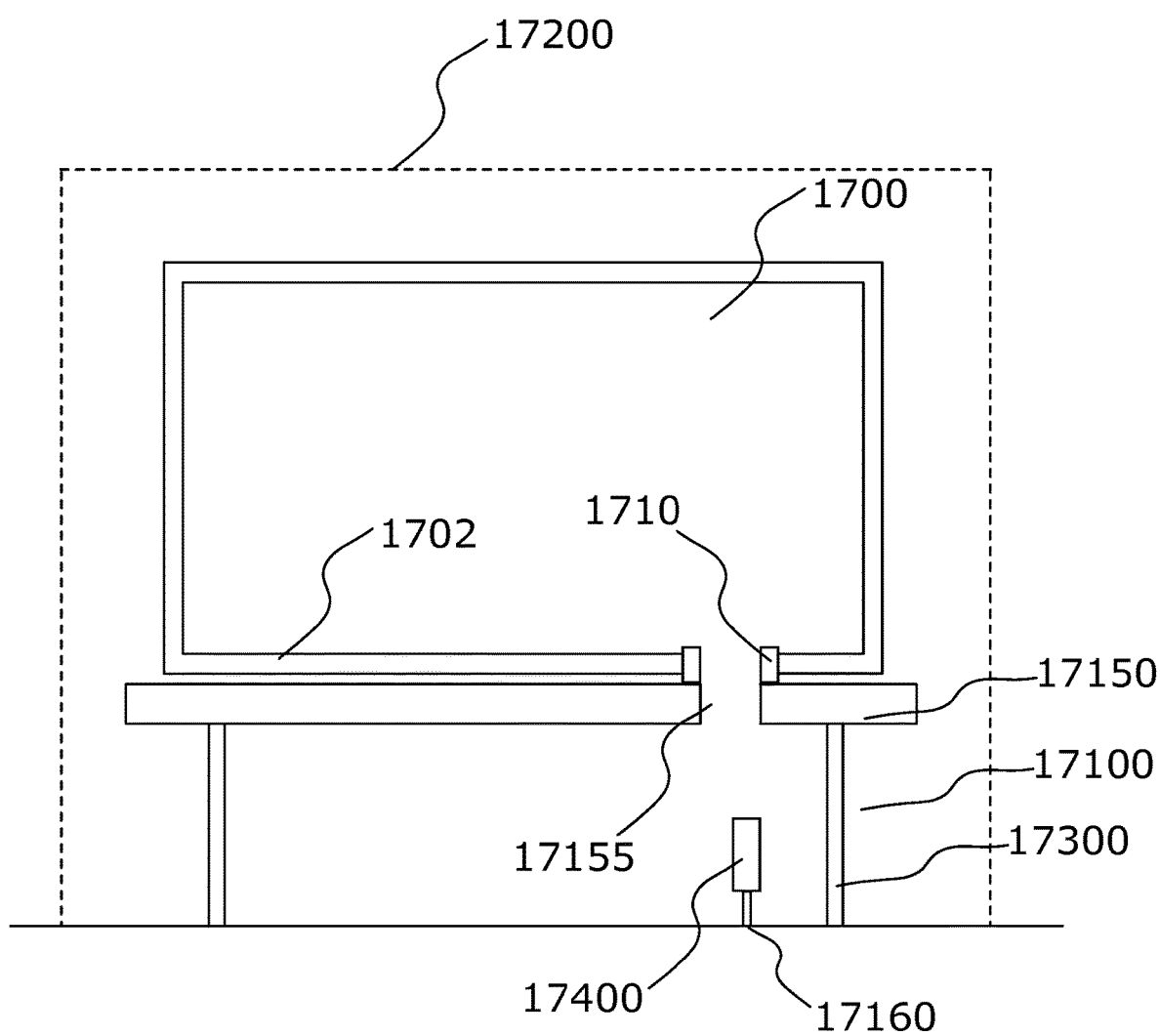
Figure 18:
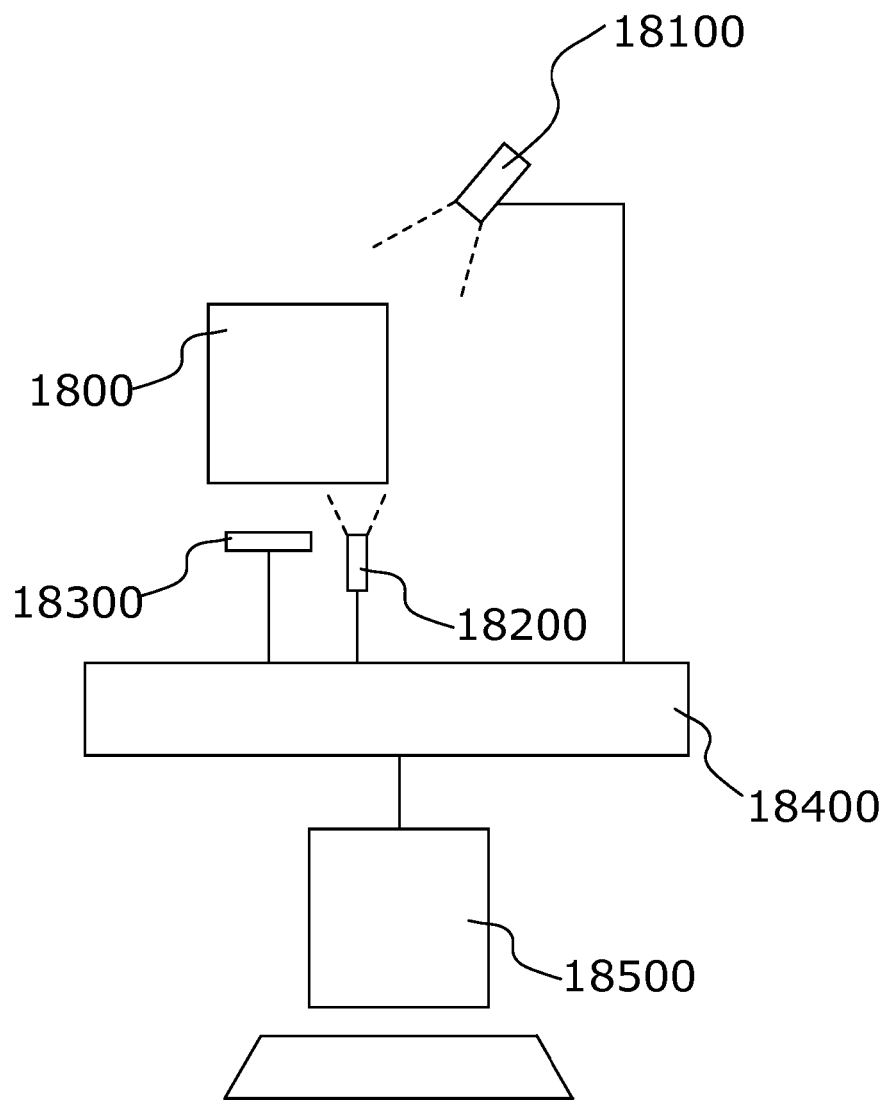

FIG. 17 is a schematic view of an embodiment of the invention for examining a grommet of a FOUP, and FIG. 18 is a schematic view of a further preferred embodiment of the invention.

FIGS. 1 A-1B illustrate side views of an inspection chamber of a visual inspection system. The visual inspection system may be configured to inspect containers, such as a FOUP, through capturing digital images with a camera, which is then processed by an algorithm coupled to a memory and a processor of a data processing unit. The FOUP body and lid may be inspected in a single chamber together or separately. The FOUP body and lid may also be inspected in a separate body inspection chamber and a separate lid inspection chamber.

Figure 1A:
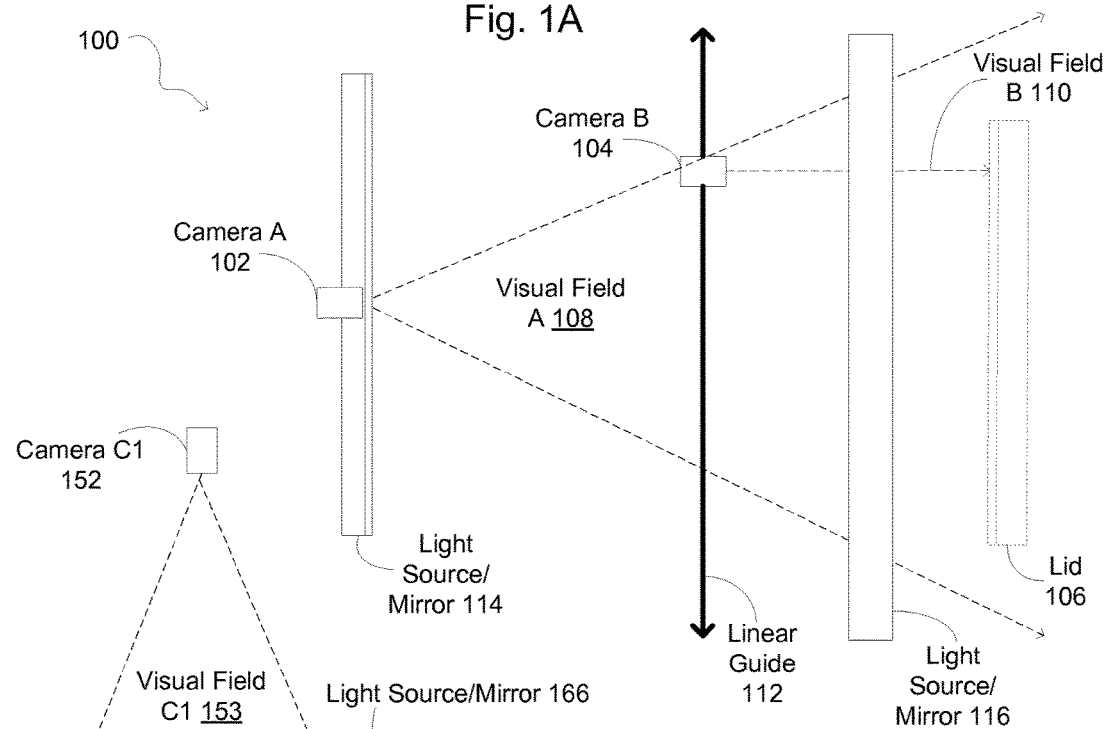
FIG. 1A shows a schematic side view of a first embodiment of the invention.

FIG. 1A shows a side view of the lid inspection chamber 100, comprising camera A 102, camera B 104, and lid 106. Camera A 102 may be positioned farther away from lid 106 than camera B 104; therefore, camera A 102 may comprise a visual field A 108 that is wider than a visual field B 110 of camera B 104. The visual field A 108 may encompass the entire lid 106. The visual field B 110 may be directed at a point of interest on the lid 106, such as a perimeter surface of the lid 106. Camera B 104 may be coupled to linear guide 112. Linear guide 112 may allow camera 104 B to move along an X-axis that permits visual field B to be directed at different locations of lid 106, such as tracing lid 106's perimeter and/or within lid 106's perimeter. One or more other linear guide (not shown), may also be coupled to camera B 104, and may allow camera B 104 to move in a Y-axis and/or a Z-axis. The lid inspection chamber 100 may comprise light source/mirror 114 and/or light source/mirror 116. Light source/mirror 116 may comprise of four linear light sources and/or mirrors arranged in a square-shaped configuration directly above and/or slightly beyond lid 106's perimeter to provide maximal lighting of lid 106. The perimeter of the light source/mirror 116 may be square-shaped, circularshaped, triangular-shaped, oval-shaped, or any combination thereof.

Figure 1B:
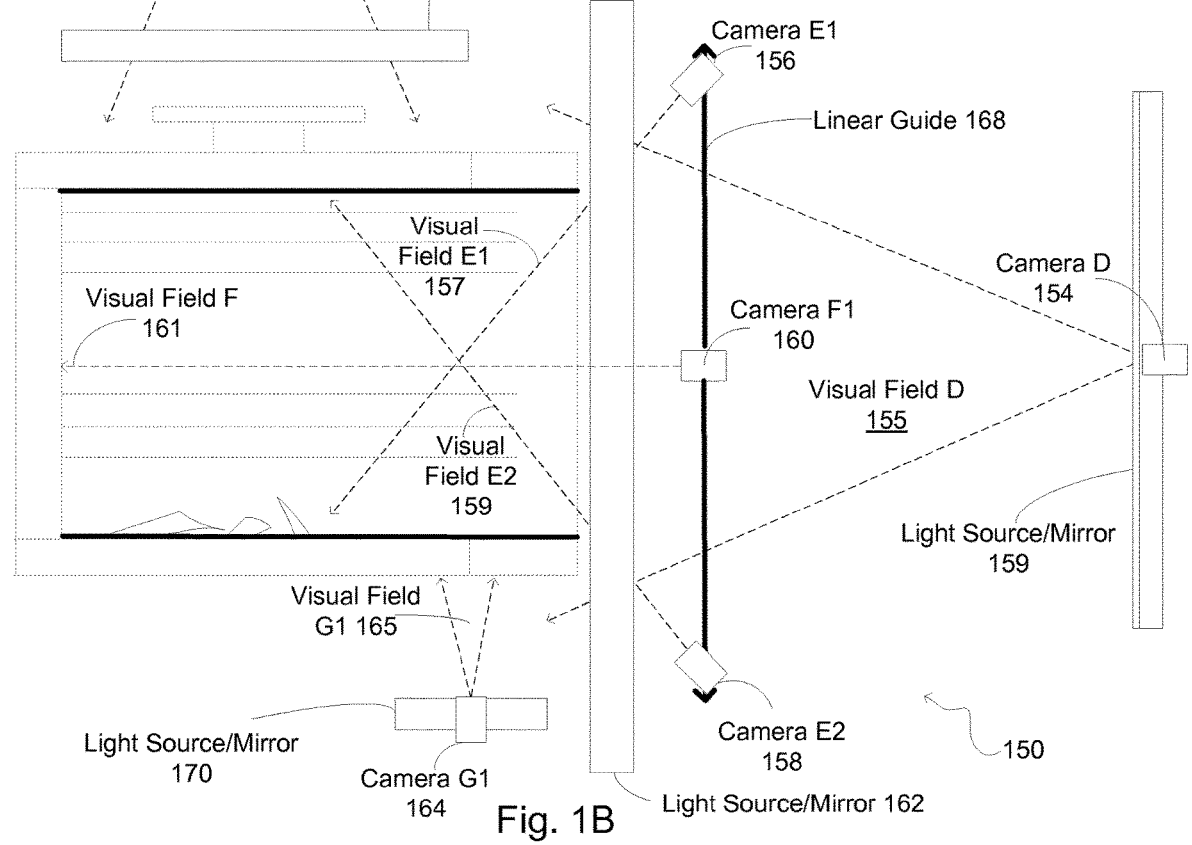
FIG. 1B shows a schematic side view of a second embodiment of the invention.

FIG. 1B shows a side of the body inspection chamber 150, comprising camera C1 152, visual field C1 153, camera D 154, visual field D 155, camera E1 156, visual field E1 157, camera E2 158, visual field E2 159, camera F1 160, visual field F 161, light source/mirror 162, camera G1 164, visual field G1 165, light source/mirror 166, linear guide 168, and light source/mirror 170.

Camera C1 152 may comprise visual field C1 153 that may be wider than a handling flange of a FOUP positioned within the body inspection chamber 150. Camera C1 152 may be configured to determine a height and/or a thickness of the handling flange through an algorithm coupled to a memory and a processor of a data processing unit. The light source/mirror 166 may be provided for illumination of the handling flange. The light source/mirror 166 may comprise of four linear light sources and/or mirrors arranged in a square-shaped configuration directly above and/or slightly beyond the handling flange's perimeter to provide maximal lighting of the handling flange. The perimeter of the light source/mirror 166 may be square-shaped, circularshaped, triangular-shaped, oval-shaped, or any combination thereof.

Camera D 154 may comprise visual field D 155 that may be wider than a frontal opening of a FOUP positioned within the body inspection chamber 150. Light source/mirror 159 may be provided within the proximity of camera D 154 for illumination. Camera D 154 may be used to determine presence of a wafer within the FOUP, determine the presence of broken wafer pieces within the FOUP, determine damages around a door and/or corner of the FOUP, determine the presence of correct snapped-in side support of the FOUP, and/or determine door measurements of the FOUP.

Figure 2A:
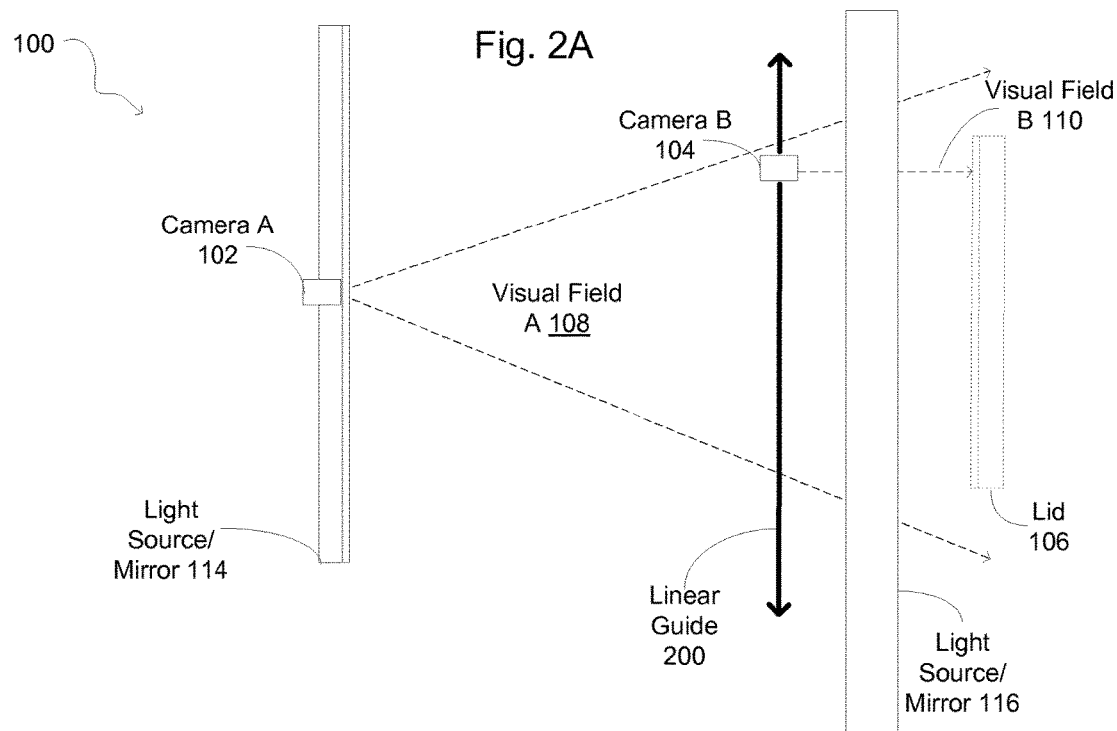
FIG. 2A shows a schematic side view of a third embodiment of the invention.
Figure 2B:
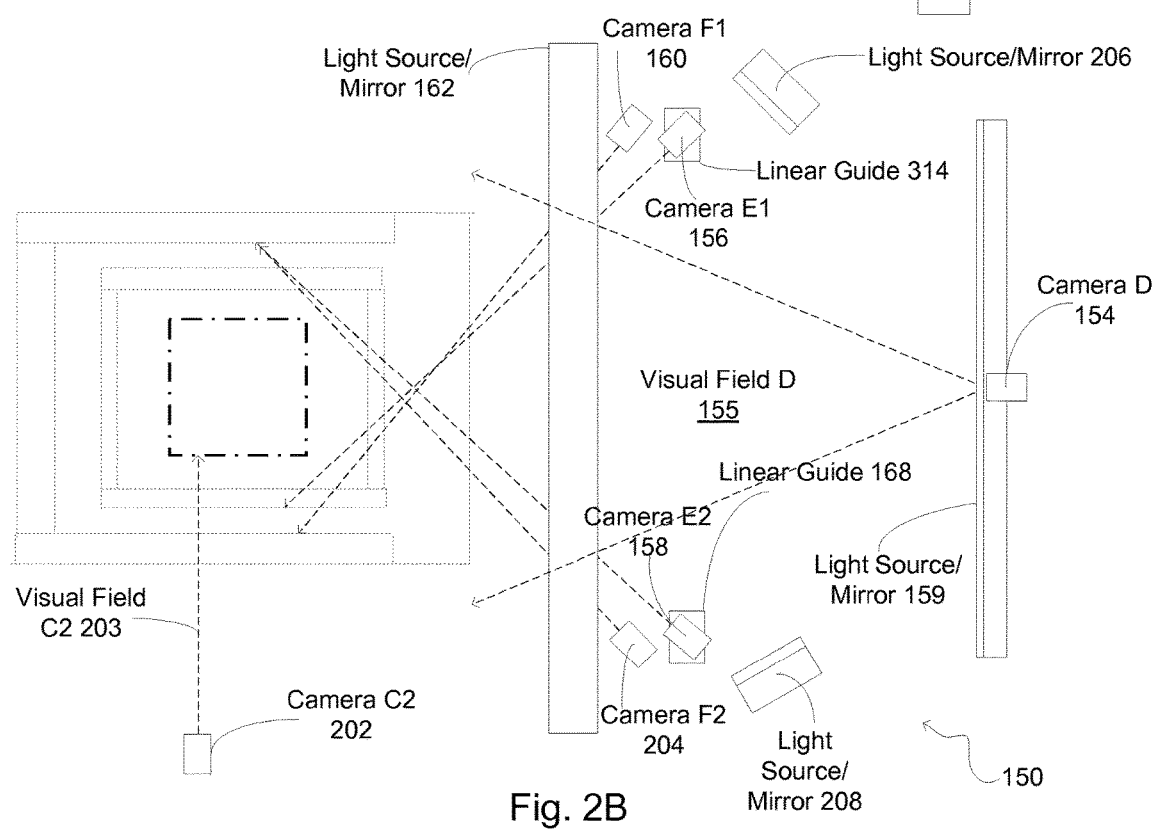
FIG. 2B shows a schematic side view of a forth embodiment of the invention.

Camera E1 156, camera E2 158, and/or camera F1 160 may all comprise at least two cameras each, as will be seen in FIG. 2B. The cameras are situated on linear guide 168 and linear guide 314 (shown in FIG. 2B), which may be positioned along a vertical axis in front of each side of the FOUP. Camera E1 156 may comprise visual field E1 157, camera E2 158 may comprise visual field E2 159, and camera F1 160 may comprise visual field F 161. Camera F2 204 and camera E2 158 may be situated on linear guide 168 and/or camera F1 160 and camera E1 156 may be situated on linear guide 314. Each camera can move along its respective linear guide to allow wide inspection visual field of a target area within a side wall of a FOUP. The wide inspection visual field may encompass an entire length and/or width of an inner side of the FOUP. Each camera may be able to swivel and pivot at a connection point on its respective linear guide.

Camera E1 156, camera E2 158, camera F1 160, and/or camera F2 204 of FIG. 2B may individually, or in combination, determine the presence of heat marks, scratches, stringers, deformed wafer support, broken wafer support, pressure mark, and melted bumper within the FOUP, such as along a slot at an inner side wall of a FOUP. The cameras may also individually or in combination determine slot height, slot tilt, slot pitch, and/or alignment of side supports.

The light source/mirror 162 may comprise four linear light sources and/or mirrors arranged in a square-shaped configuration directly in front of and/or slightly beyond a perimeter of a FOUP opening to provide maximal lighting of the FOUP opening. The perimeter of the light source/mirror 162 may be square-shaped, circular-shaped, triangular-shaped, oval-shaped, or any combination thereof. Camera G1 164 may comprise visual field G1 165, and may be coupled to light source/mirror 170. Camera G1 164 may determine characteristics of a top of the handling flange.

FIGS. 2A-2B illustrate top views of the inspection chamber of FIGS. 1A-B. FIG. 2A introduces linear guide 200 to the lid inspection chamber 100 of FIG. 1A, which may be positioned on a different axis than linear guide 112 of FIG. 1A, such as the Y-axis and/or Z-axis. Both linear guide 112 and linear guide 200 may permit camera B 104 to traverse their distance. Linear guide 112 and linear guide 200 may be positioned separately, or coupled together, for example, to allow camera B 104 to move in the X-, Y-, and/or Z-axis. FIG. 2B introduces camera C2 202, visual field C2 203, camera F2 204, light source/mirror 206, light source/mirror 208, and linear guide 314 to the body inspection chamber 150 of FIG. 1B. Camera C2 202 may comprise visual field C2 203, which may be directed along a horizontal axis of a handling flange of a FOUP. Camera C2 202 may be configured to determine a height and/or a thickness of the handling flange through an algorithm coupled to a memory and a processor of a data processing unit. Camera F2 204 and Camera E2 158 may be coupled to linear guide 168, which may traverse the vertical axis of the FOUP. Camera E2 158 may comprise two separate cameras. Camera F1 160 and camera E1 156 may be coupled to linear guide 314, which may traverse the vertical axis of the FOUP. Camera E1 156 may comprise two separate cameras. Linear guide 168 and linear guide 314 may be positioned at opposing sides of the FOUP. Light source/mirror 206 may comprise three separate light sources and/or mirrors and may be positioned in the vicinity of linear guide 314, such as directly behind linear guide 314, to provide luminance for camera F1 160 and camera E1 156. Light source/mirror 208 may comprise three separate light sources and/or mirrors and may be positioned in the vicinity of linear guide 168, such as directly behind linear guide 168, to provide luminance for camera F2 204 and camera E2 158.

Figure 3A:
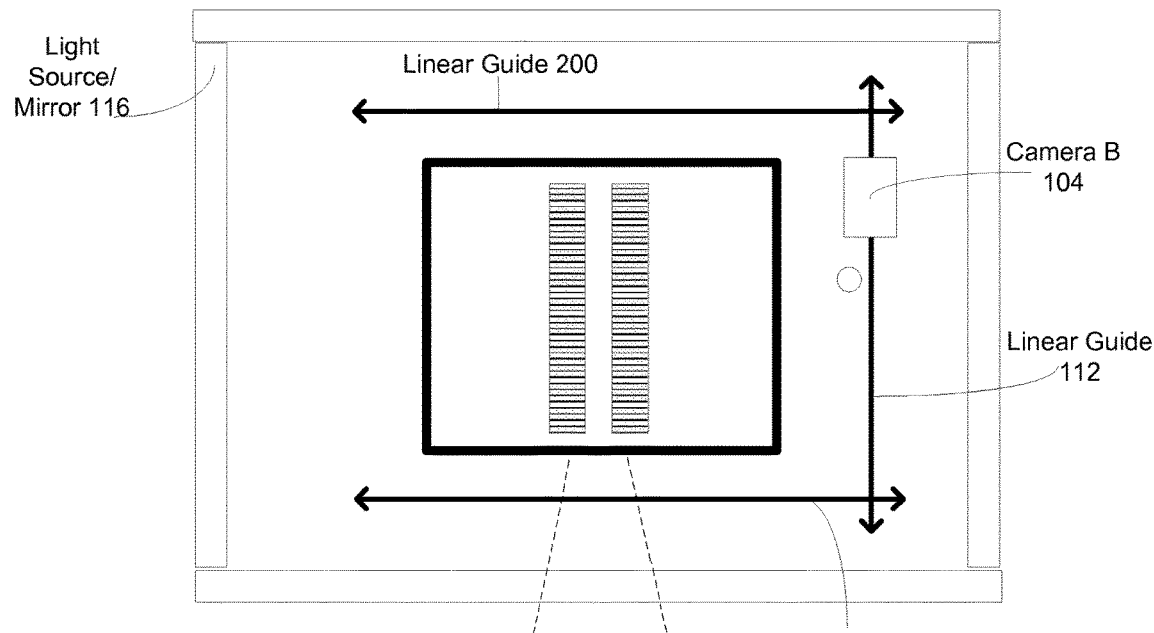
FIG. 3A shows a schematic side view of a fifth embodiment of the invention.
Figure 3B:
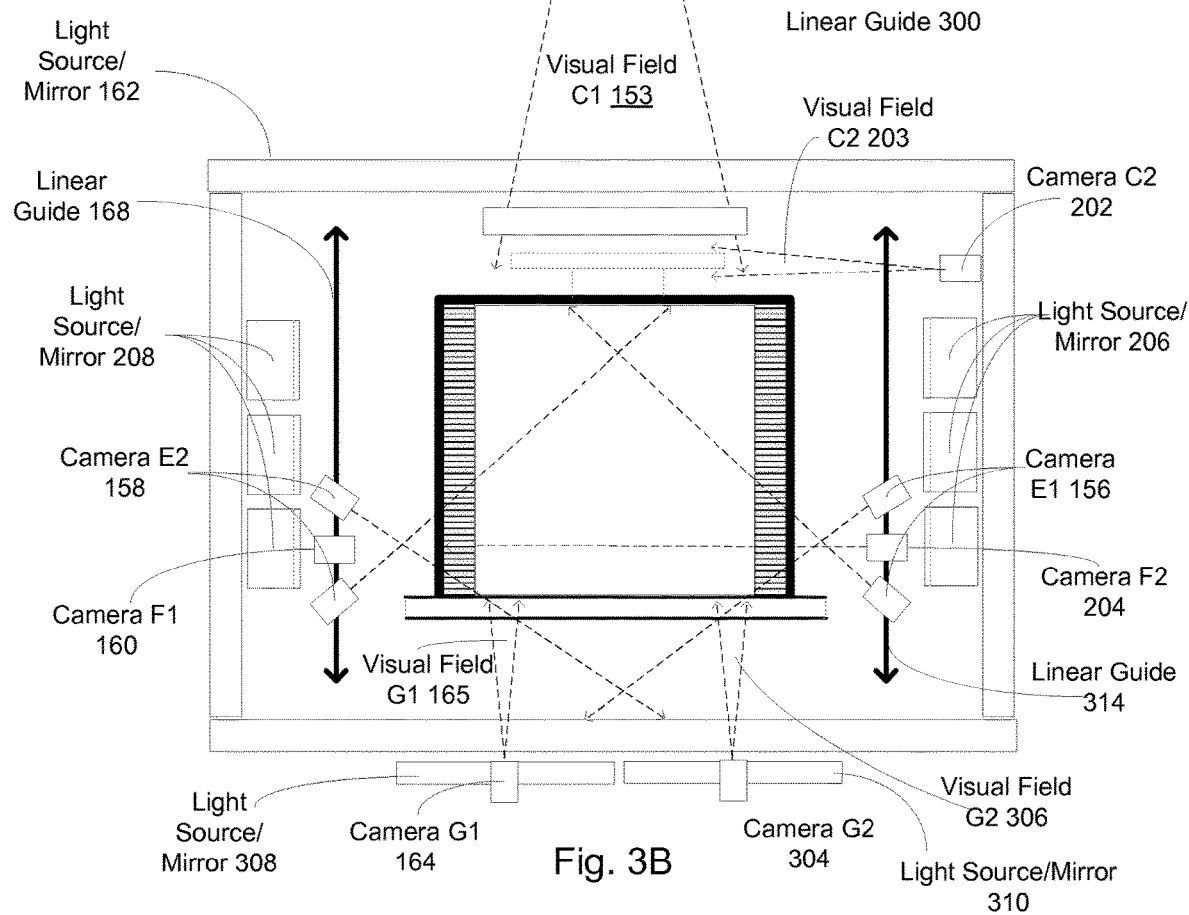
FIG. 3B shows a schematic side view of a sixth embodiment of the invention.

FIGS. 3A-3B illustrate front views of the inspection chamber of FIGS. 1A-B and FIGS. 2A-B. FIG. 3A introduces linear guide 300, which may be positioned on the same axis as linear guide 200, or a different axis than linear guide 200 and linear guide 112, such as a Z-axis, and may accommodate depth and focus variation through movement of camera B 104. Linear guide 112, linear guide 200, and/or linear guide 300 may be positioned separately or coupled together in any combination.

FIG. 3B introduces camera G2 304, visual field G2 306, light source/mirror 308, and light source/mirror 310. Camera G2 304 may compliment camera G1 164 of FIG. 1 to determine characteristics of the top of the handling flange. Camera G2 304 may comprise visual field G2 306, and may be coupled to light source/mirror 310. More apparent in this figure than FIG. 1 is that camera E2, which may comprise two cameras, and camera F1 160 may both be coupled to linear guide 168. On the other hand, camera E1 156, which may also comprise two cameras, and camera F2 204 may both be coupled to linear guide 314.

Figure 4:
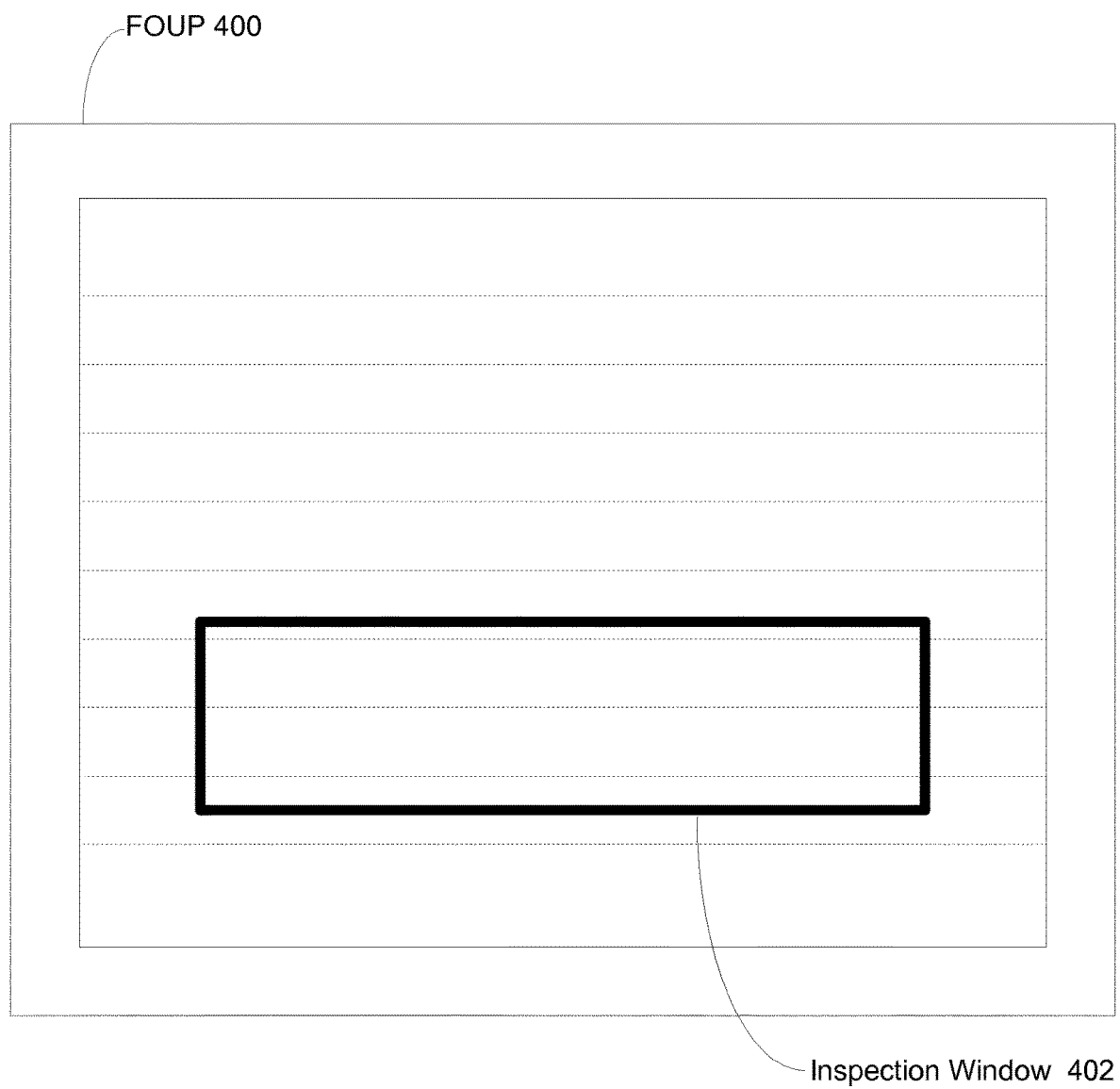
FIG. 4 is a schematic side view of a front opening of a FOUP.

FIG. 4 illustrates a front opening of a FOUP, as detected by visual field D 155 of camera D 154 of FIG. 1. An inspection window 402 may scan an inner back wall of a FOUP 400 positioned within an inspection chamber of a visual inspection system. The inspection window 402 may be square-shaped, circular-shaped, triangular-shaped, oval-shaped, or any combination thereof. The inspection window 402 may scan the FOUP for perimeter lines that may be associated with the presence of one or more wafers. The scanning of the inspection window 402 may begin and/or end at the top, bottom, and/or intermediate section of the FOUP. The scanning of the inspection window 402 may be continuous or intermittent. The detection of the presence of one or more wafers may have an accuracy of above 400 μm (thickness) and a resolution of 0.2 mm/px.

FIG. 5 illustrates a front opening of a FOUP, as detected by visual field D 155 of camera D 154 of FIG. 1. An inspection window 502 may scan an inner perimeter of a FOUP 500 positioned within an inspection chamber of a visual inspection system. The scanning of the inner perimeter may detect particle 504 contamination within the FOUP, for example, pieces of broken wafers. The inspection window 402 may be square-shaped, circular-shaped, triangular-shaped, oval-shaped, or any combination thereof. The scanning of the inspection window 502 may be continuous or intermittent. The detection of the presence of particles 504 may have an accuracy of 5 mm×5 mm and a resolution of 0.2 mm/px.

FIG. 6 illustrates a front opening of a FOUP, as detected by visual field D 155 of camera D 154 of FIG. 1. An inspection window 602 may scan an outer perimeter of a FOUP 600 positioned within an inspection chamber of a visual inspection system. The inspection window 602 may be wider than the inspection window 502 from FIG. 5. The scanning of the outer perimeter may detect damages and/or deformities of the perimeter, such as damages to a door and/or a broken corner of the FOUP 600. The inspection window 602 may be square-shaped, circular-shaped, triangular-shaped, oval-shaped, or any combination thereof. The scanning of the inspection window 602 may be continuous or intermittent. The detection of damages and/or deformities of the perimeter of the FOUP 600 may have an accuracy of 2 mm×2 mm and a resolution of 0.2 mm/px.

FIG. 7 illustrates a front opening of a FOUP, as detected by visual field D 155 of camera D 154 of FIG. 1. Inspection window 702 may comprise at least one square-shaped, circularshaped, triangular-shaped, and/or oval-shaped inspection field that may be positioned at each corner of a FOUP 700. Inspection window 702 may determine the presence of correct snapped in side support of the FOUP 700. The inspection window 702 may be square-shaped, circularshaped, triangular-shaped, oval-shaped, or any combination thereof. The scanning of the inspection window 702 may be continuous or intermittent. The detection of correct snapped-in side support of the FOUP 700 may have a resolution of 0.2 mm/px.

FIG. 8 illustrates a door of a FOUP, as detected by visual field D 155 of camera D 154 of FIG. 1. Measurement line 802 and measurement point 804 may indicate beginning and end of a measurement of a FOUP door. The measure of the FOUP door may have an accuracy of +/−0.5 mm and a resolution of 0.2 mm/px.

FIG. 9 illustrates a handling flange of a FOUP 900 (only part of the top side of which is shown in FIG. 9). The handling flange, designated 905, is provided as an extension to the top side of a FOUP 900. The surface of the top side of the FOUP is schematically shown and designated 910. As can be seen from FIG. 9, the handling flange has a height 920, and a thickness 930. Visual field C1 153 of camera C1 152 and/or visual field C203 of camera C2 202 may determine measurements of the handling flange, such as handling flange height 920, with an accuracy of +/−0.1 mm and a resolution of 0.06 mm/px, and/or handling flange thickness 930, with an accuracy of +/−0.1 mm and a resolution of 0.06 mm/px.

FIG. 10 illustrates an inner side wall of a FOUP, as detected by visual field E1 157 of camera E1 156, visual field E2 159 of camera E2 158, and/or visual field F 161 of camera F1 160 of FIG. 1. Inspection window 1002 may comprise at least one circular-shaped, squareshaped, triangular-shaped, and/or oval-shaped inspection field that may be positioned above a deformation 1004 when detected, such as a heat mark and/or a scratch on the inner side wall of FOUP 1000. The scanning of the inspection window 1002 may be continuous or intermittent.

The detection of deformation 1004 of the FOUP 1000 may have an accuracy of above 400 μm width and a resolution of 0.05 mm/px.

FIG. 11 illustrates an inner wall of a lid of a FOUP, as detected by visual field A 108 of camera A 102 of FIG. 1. Inspection window 1102 may comprise a double square-shaped inspection field that may position a seal 1104 in between, e.g. a gasket of FOUP 1100. Inspection window 1102 may detect damages and/or deformities to seal 1104. As can be seen from FIG. 11, the double square-shaped inspection field is defined by an outer square 1150 and an inner square 1160, concentrically arranged within outer square 1150. The scanning of the inspection window 1102 may be continuous or intermittent. The detection of damages and/or deformities of seal 1104 may have an accuracy of 0.5 mm×0.5 mm and a resolution of 0.2 mm/px. The scanning of the inspection window 1102 may also detect the presence of the seal, and may have an accuracy (min contrast gray value) >20 and a resolution of 0.2 mm/px. The scanning of the inspection window 1102 may also determine the position of the gasket. The system may be able to detect that gasket position may be off in the X-axis, Y-axis, and/or Z-axis with an accuracy of +/−1 mm and a resolution of 0.2 mm/px. Such a gasket can, according to a further preferred embodiment of the invention, additionally and/or alternatively, be examined by an ultrasonic detection device. Especially a combination of a visual detection device, such as a camera, with an ultrasonic detection device is advantageous, as this renders a reliable examination of a surface and also the inside state of such a gasket possible.

FIG. 12 illustrates an inner side wall of a FOUP, as detected by visual field E1 157 of camera E1 156, visual field E2 159 of camera E2 158, and/or visual field F 161 of camera F1 160 of FIG. 1. Slot height A 1202 may be a determined height measurement of a second slot of the inner side wall of the FOUP. Slot height A 1202 may be 54 mm. Slot height B 1204 may be a determined height measurement of a first slot of the inner side wall of the FOUP. Slot height B 1204 may be 44 mm. In at least one embodiment, visual field E1 157 of camera E1 156, visual field E2 159 of camera E2 158, and/or visual field F 161 of camera F1 160 may also determine slot pitch of slots of the inner side wall of the FOUP. The determination of slot height and slot pitch may have an accuracy of +/−0.1 mm (if bumpers, then front and rear bumpers; otherwise then only front cross section) and a resolution of 0.05 mm/px.

FIG. 13 illustrates an inner wall of a lid of a FOUP, as detected by visual field A 108 of camera A 102 of FIG. 1. Inspection window 1302 may comprise two square-shaped inspection fields that may be positioned over a lid retainer to determine whether it is snapped into place, and may have an accuracy of 2 mm×2 mm and a resolution of 0.2 mm/px.

FIG. 14 illustrates an inner side wall of a FOUP, as detected by visual field E1 157 of camera E1 156, visual field E2 159 of camera E2 158, and/or visual field F 161 of camera F1 160 of FIG. 1. Inspection window 1402 may comprise at least one circular-shaped, square-shaped, triangular-shaped, and/or oval-shaped inspection field that may be positioned above a deformation 1404 when detected, such as stringers on the inner side wall of FOUP 1400. The scanning of the inspection window 1402 may be continuous or intermittent. The detection of deformation 1404 of the FOUP 1400 may have an accuracy of 400 μm×500 μm and a resolution of 0.05 mm/px.

FIG. 15 illustrates an inner side wall of a FOUP, as detected by visual field E1 157 of camera E1 156, visual field E2 159 of camera E2 158, and/or visual field F 161 of camera F1 160 of FIG. 1. Inspection window 1502 may comprise at least one circular-shaped, squareshaped, triangular-shaped, and/or oval-shaped inspection field that may be positioned above a deformation 1504 when detected, such as deformed wafer support (accuracy: +/−200 μm, resolution: 0.05 mm/px), broken wafer support (accuracy: 5 mm×5 mm, resolution: 0.05 mm/px), and/or pressure mark (accuracy: 5 mm×5 mm, resolution: 0.05 mm/px) on the inner side wall of FOUP 1500. The scanning of the inspection window 1502 may be continuous or intermittent.

FIG. 16 illustrates an inner side wall of a FOUP, as detected by visual field E1 157 of camera E1 156, visual field E2 159 of camera E2 158, and/or visual field F 161 of camera F1 160 of FIG. 1. Inspection window 1602 may comprise at least one square-shaped, circularshaped, triangular-shaped, and/or oval-shaped inspection field that may be positioned above a deformation 1604 (may also be a target area not necessarily comprising deformation) when detected, such as melted bumper (accuracy: above 500 μm for perpendicular teeth, resolution: 0.05 mm/px), alignment of side supports, front- and backside, every second slot measured (accuracy: +/−150 pm, resolution 0.05 mm/px), and/or slot tilt (accuracy: +/−0.5°, resolution: 0.05 mm/px) on the inner side wall of FOUP 1600. The scanning of the inspection window 1602 may be continuous or intermittent.

In addition to the above inspection features, visual field B 110 of camera B 104 may detect the presence of a filter, an inlet, and/or an outlet at a FOUP bottom with an accuracy with minimum contrast gray value >20, and a resolution of 0.13 mm/px. Visual field A 108 of camera A 102 may detect an inner wall of a lid of a FOUP. An inspection window may comprise a square-shaped inspection field and may detect damages to a retainer tips of the lid. The detection of damagers to the retainer tips may have an accuracy of 2 mm×2 mm, and a resolution of 0.2 mm/px. Visual field G1 165 of camera G1 164 may determine characteristics and/or measurements of a handling flange top with an accuracy of +/−0.1 mm and a resolution of 0.06 mm/px.

FIG. 17 shows a schematic view of a FOUP 1700 provided with a grommet 1710 in its lower side 1702. Be it noted that this depiction of a FOUP and a grommet is purely schematical, further details of the FOUP having been omitted. Grommet 1710 can interact with a (not shown) nozzle, for example in order to purge the inside of FOUP 1700 with an expedient gas such as N$_2$. The FOUP 1700 is positioned on an inspection table 17100, which can be part of an inspection chamber 17200 (schematically shown in dashed lines).

The inspection table 17100 may be provided with schematically shown load sensors 17300 for measuring the weight of FOUP 1700 together with its contents.

As can be seen from FIG. 17, inspection table 1710 comprises an upper platform 17150, on which the FOUP 1700 is placed, and a lower platform 17160, on which the load sensor 17300 rest. Upper platform 17150 is provided with an opening 17155, over which the grommet 1710 is positioned. This means, the grommet 1710 is accessible from the space between upper and lower platform 17150, 17160. However, this space is not sufficient for sufficiently positioning a camera, so that, according to this embodiment, an ultrasonic sensor 17400 (schematically shown) is positioned in this space, by means of which the grommet 1710 can be examined.

Finally, FIG. 18 shows a preferred embodiment of the inspection system according to the invention. Here, for inspection of a FOUP 1800, at least one camera 18100, at least ultrasonic sensor 18200, and at least one load sensor 18300 are provided, each of which is connected to a data processing unit 18400. This data processing unit 18400 is connected to a terminal device 18500, for example comprising a monitor and a keyboard. By means of such a terminal device, input orders may be entered into the system, and also inspection results readily displayed.

The invention claimed is:

1. Inspection system configured to determine a state of wear of a container, for a wafer or reticle, or at least a part of the container, comprising:
 a detection device or a multitude of detection devices configured to receive container surface detection data, separate and distinct from each wafer or reticle carried by the container, from a surface and/or interior of the container or the part of the container separate and distinct from each wafer or reticle carried by the container, wherein the received container surface detection data, separate and distinct from each wafer or reticle carried by the container, is indicative of wear of the container or the part of the container, separate and distinct from each respective wafer or reticle carried by the container, which received container surface detection data, separate and distinct from each wafer or reticle carried by the container, embodies the state of wear of the container or the part of the container, separate and distinct from each respective wafer or reticle carried by the container; and
 a data processor configured to identify the state of wear based on the received container surface detection data separate and distinct from each respective wafer or reticle carried by the container.

2. Inspection system according to claim 1, wherein the container is a FOUP.

3. Inspection system according to claim 1, wherein each detection device comprises a camera, the detection data being provided as image data.

4. Inspection system according to claim 3, wherein the camera comprises at least two cameras, at least one of which being adapted to provide a variable visual field.

5. Image system according to claim 1, wherein the detection device or at least one of the multitude of detection devices is coupled to a positioning system.

6. Inspection system according to claim 1, wherein the detection device is provided to be coupled to a linear guide and/or to swiveling and/or pivoting means.

7. Inspection system according to claim 1, the detection device or at least one of the multitude of detection devices being adapted to produce a digital image of an area of interest on the surface of the container, the inspection system further comprising a data processing unit adapted for processing produced digital images by means of an algorithm coupled to a memory and a processor of the data processing unit to identify the state and/or the content of the container.

8. Inspection system according to claim 3, wherein at least the camera or at least one of the multitudes of cameras includes a reflecting mirror comprising two or more reflecting surfaces to split incident light into two portions and to direct these portions onto two linear image sensing devices mounted on an inner surface of a camera body at separate positions.

9. Inspection system according to claim 3, wherein the camera or at least one of the multitude of cameras is provided with adjustable shielding plates adapted to vary a field of view.

10. Inspection device according to claim 1, wherein the detection device or the multitude of detection devices comprises an ultrasonic detection device or a multitude of ultrasonic detection devices and/or a laser detection device or a multitude of laser detection devices.

11. Inspection system according to claim 1, wherein the inspection system is further configured to determine a content of the container where the detection device or the multitude of detection devices comprises at least one device or a multitude of devices for measuring a weight of the container.

12. Inspection system according to claim 11, wherein the device or at least one of the multitude of devices for measuring the weight of the container comprises at least one load cell.

13. Inspection system according to claim 1, comprising a first camera and a second camera, wherein camera is positioned further away from a surface area of the container of interest than the second camera, such that a visual field of first camera is wider than a visual field of second camera.

14. Inspection system according to claim 1, comprising a light source and/or mirror or a multitude of light sources and/or mirrors.

15. Inspection system according to claim 14, wherein the light source and/or mirror or at least one of the multitude of light sources/mirrors comprises a plurality, especially, two, three or four linear light sources and/or mirrors arranged in a square-shaped configuration, a circular-shaped configuration, a triangular-shaped configuration or an oval-shaped configuration or any combination thereof.

16. Inspection system according to claim 15, wherein the light source and/or mirror or at least one of the multitude of light sources/mirrors comprises four linear light sources and/or mirrors arranged in a square-shaped configuration directly above and/or slightly beyond a perimeter of a container lid or above and/or slightly beyond a parameter of a handling flange of the container or in front of and/or slightly beyond a perimeter of the container opening or in front and/or slightly beyond an outside or inside surface of the container.

17. Inspection system according to claim 1, wherein the detection device or at least one of the multitude of detection devices is adapted to scan an inspection window, wherein the inspection window is square-shaped, circular-shaped, triangular-shaped, oval-shaped or any combination thereof, the detection device or at least one of the multitude of detection devices being adapted to scan the inspection window continuously or intermittently.

18. Inspection system according to claim 17, wherein the inspection window comprises a double square-shaped inspection field adapted to correspond to a seal or a gasket of the container.

19. Inspection chamber adapted for determining a state and/or content of at least part of the container, comprising a chamber for receiving at least part of the container, and an inspection system according to claim 1.

20. A workpiece container inspection system, the workpiece container being configured to hold and carry workpieces within the workpiece container, the workpiece container inspection system comprising:
- a detection device that forms a container inspection field disposed to inspect a container feature separate and distinct from a workpiece held within the workpiece container, where the detection device is configured to detect the container feature, separate and distinct from the workpiece held within the workpiece container, in the container inspection field and generate detection data, separate and distinct from the workpiece held within the workpiece container, that embodies a container feature wear characteristic of the detected container feature; and
- a data processor configured to identify a state of wear of the container feature based on the container feature wear characteristic embodied in the detection data, separate and distinct from the workpiece held within the workpiece container.

21. The workpiece container inspection system of claim 20, wherein the detection device comprises at least one camera, the detection data being provided as image data.

22. The workpiece container inspection system of claim 20, wherein the detection device is coupled to a positioning system.

23. The workpiece container inspection system of claim 20, wherein the detection device comprises at least one ultrasonic detection device.

24. The workpiece container inspection system of claim 20, wherein the detection device comprises at least one laser detection device.

25. The workpiece container inspection system of claim 20, wherein the detection device comprises at least one device for measuring a weight of the workpiece container.

26. The workpiece container inspection system of claim 20, further comprising one or more of a light source and a mirror.

* * * * *